(12) United States Patent
Wang et al.

(10) Patent No.: US 10,600,794 B2
(45) Date of Patent: Mar. 24, 2020

(54) TWIN BIT NON-VOLATILE MEMORY CELLS WITH FLOATING GATES IN SUBSTRATE TRENCHES

(71) Applicant: Silicon Storage Technology, Inc., San Jose, CA (US)

(72) Inventors: Chunming Wang, Shanghai (CN); Andy Liu, Shanghai (CN); Xian Liu, Sunnyvale, CA (US); Leo Xing, Shanghai (CN); Melvin Diao, Shanghai (CN); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/160,812

(22) Filed: Oct. 15, 2018

(65) Prior Publication Data

US 2019/0214396 A1 Jul. 11, 2019

(30) Foreign Application Priority Data

Jan. 5, 2018 (CN) .......................... 2018 1 0011007

(51) Int. Cl.
| | |
|---|---|
| *H01L 29/66* | (2006.01) |
| *H01L 29/788* | (2006.01) |
| *H01L 29/423* | (2006.01) |
| *H01L 27/11521* | (2017.01) |
| *H01L 27/11524* | (2017.01) |
| *H01L 21/28* | (2006.01) |

(52) U.S. Cl.
CPC .. *H01L 27/11521* (2013.01); *H01L 27/11524* (2013.01); *H01L 29/66825* (2013.01); *H01L 29/7881* (2013.01); *H01L 29/40114* (2019.08); *H01L 29/42328* (2013.01); *H01L 29/42332* (2013.01); *H01L 29/42336* (2013.01); *H01L 29/7885* (2013.01)

(58) Field of Classification Search
None
See application file for complete search history.

(56) References Cited

U.S. PATENT DOCUMENTS

| | | |
|---|---|---|
| 5,029,130 A | 7/1991 | Yeh |
| 6,093,606 A | 7/2000 | Lin |
| 6,747,310 B2 | 6/2004 | Fan et al. |

(Continued)

FOREIGN PATENT DOCUMENTS

| | | |
|---|---|---|
| TW | 201705379 | 2/2017 |
| TW | 201727721 | 8/2017 |

*Primary Examiner* — Sonya D. McCall-Shepard
(74) *Attorney, Agent, or Firm* — DLA Piper LLP (US)

(57) ABSTRACT

A twin bit memory cell includes first and second spaced apart floating gates formed in first and second trenches in the upper surface of a semiconductor substrate. An erase gate, or a pair of erase gates, are disposed over and insulated from the floating gates, respectively. A word line gate is disposed over and insulated from a portion of the upper surface that is between the first and second trenches. A first source region is formed in the substrate under the first trench, and a second source region formed in the substrate under the second trench. A continuous channel region of the substrate extends from the first source region, along a side wall of the first trench, along the portion of the upper surface that is between the first and second trenches, along a side wall of the second trench, and to the second source region.

12 Claims, 23 Drawing Sheets

(56) References Cited

U.S. PATENT DOCUMENTS

| | | |
|---|---|---|
| 6,855,980 B2 | 2/2005 | Wang et al. |
| 6,952,034 B2 | 10/2005 | Hu et al. |
| 7,151,021 B2 | 12/2006 | Chen et al. |
| 7,315,056 B2 | 1/2008 | Klinger |
| 7,868,375 B2 | 1/2011 | Liu et al. |
| 8,148,768 B2 | 4/2012 | Do et al. |
| 8,711,636 B2 | 4/2014 | Do et al. |
| 2004/0238874 A1 | 12/2004 | Chen et al. |
| 2005/0077566 A1 | 4/2005 | Zheng |
| 2005/0169041 A1 | 8/2005 | Wang |
| 2007/0018240 A1* | 1/2007 | Chindalore ............ B82Y 10/00 257/330 |
| 2013/0313626 A1 | 11/2013 | Huang |
| 2014/0269102 A1 | 9/2014 | Hewitt |
| 2018/0040376 A1* | 2/2018 | Delalleau ................ G11C 16/12 |

\* cited by examiner

TWIN BIT NON-VOLATILE MEMORY CELLS WITH FLOATING GATES IN SUBSTRATE TRENCHES

RELATED APPLICATION

This application claims the benefit of Chinese Patent Application No. 201810011007.1 filed Jan. 5, 2018.

FIELD OF THE INVENTION

The present invention relates to non-volatile memory devices.

BACKGROUND OF THE INVENTION

Currently, non-volatile memory devices formed on the planar surface of a semiconductor substrate are well known. See for example U.S. Pat. Nos. 5,029,130, 6,747,310, 6,855,980, 7,315,056, 7,868,375 and 8,711,636. Each of these patents discloses a split gate non-volatile memory cell, where the source and drain regions are formed at the surface of the substrate, so that the channel region extending between the source and drain regions extends along the surface of the substrate. The conductivity of the channel region is controlled by a floating gate and a second gate (e.g. a word line gate) disposed over and insulated from the channel region of the substrate.

In an effort to increase the number of memory cells that can be formed in a given area of the substrate surface, trenches can be formed into the surface of the substrate, where a pair of memory cells are formed inside the trench. See for example, U.S. Pat. Nos. 6,952,034, 7,151,021 and 8,148,768. With these configurations, the source region is formed underneath the trench, whereby the channel region extends along the sidewall of the trench and the surface of the substrate (i.e. the channel region is not linear). By burying a pair of floating gates in each trench, the overall size of the memory cells as a function of substrate surface area space is reduced. Also, by burying two floating gates in each trench, pairs of memory cells sharing each trench also meant a reduction in surface area space occupied by each pair of memory cells.

There is a need to further reduce the size of pairs of memory cells as a function of substrate surface area space, so that more memory cells can be formed in any give surface area unit of the substrate.

BRIEF SUMMARY OF THE INVENTION

The aforementioned problems and needs are addressed by a twin bit memory cell that includes a semiconductor substrate having an upper surface, first and second trenches formed into the upper surface and spaced apart from each other, a first floating gate of conductive material disposed in the first trench and insulated from the substrate, a second floating gate of conductive material disposed in the second trench and insulated from the substrate, a first erase gate of conductive material disposed over and insulated from the first floating gate, a second erase gate of conductive material disposed over and insulated from the second floating gate, a word line gate of conductive material disposed over and insulated from a portion of the upper surface that is between the first and second trenches, a first source region formed in the substrate under the first trench, and a second source region formed in the substrate under the second trench. A continuous channel region of the substrate extends from the first source region, along a side wall of the first trench, along the portion of the upper surface that is between the first and second trenches, along a side wall of the second trench, and to the second source region.

A twin bit memory cell includes a semiconductor substrate having an upper surface, first and second trenches formed into the upper surface and spaced apart from each other, a first floating gate of conductive material disposed in the first trench and insulated from the substrate, a second floating gate of conductive material disposed in the second trench and insulated from the substrate, a first erase gate of conductive material disposed over and insulated from the first floating gate, a second erase gate of conductive material disposed over and insulated from the second floating gate, a word line gate of conductive material disposed over and insulated from a portion of the upper surface that is between the first and second trenches, a first source region formed at the upper surface of the substrate adjacent the first trench, and a second source region formed at the upper surface of the substrate adjacent the second trench. A continuous channel region of the substrate extends from the first source region, along a first side wall of the first trench, along a bottom wall of the first trench, along a second side wall of the first trench, along the portion of the upper surface that is between the first and second trenches, along a first side wall of the second trench, along a bottom wall of the second trench, along a second side wall of the second trench and to the second source region.

A twin bit memory cell includes a semiconductor substrate having an upper surface, first and second trenches formed into the upper surface and spaced apart from each other, first and second floating gates of conductive material disposed in the first trench spaced apart from each other and insulated from the substrate, third and fourth floating gates of conductive material disposed in the second trench spaced apart from each other and insulated from the substrate, a first erase gate of conductive material disposed over and insulated from the first and second floating gates, a second erase gate of conductive material disposed over and insulated from the third and fourth floating gates, a word line gate of conductive material disposed over and insulated from a portion of the upper surface that is between the first and second trenches, a first source region formed in the substrate under the first trench, a second source region formed in the substrate under the second trench, a first control gate of conductive material disposed in the first trench, and between and insulated from the first and second floating gates, and a second control gate of conductive material disposed in the second trench, and between and insulated from the third and fourth floating gates. A continuous channel region of the substrate extends from the first source region, along a side wall of the first trench, along the portion of the upper surface that is between the first and second trenches, along a side wall of the second trench, and to the second source region.

A method of forming a twin bit memory cell, includes forming first and second trenches into an upper surface of a semiconductor substrate, wherein the first and second trenches are spaced apart from each other, forming a first floating gate of conductive material in the first trench and insulated from the substrate, forming a second floating gate of conductive material in the second trench and insulated from the substrate, forming a first erase gate of conductive material over and insulated from the first floating gate, forming a second erase gate of conductive material over and insulated from the second floating gate, forming a word line gate of conductive material over and insulated from a portion of the upper surface that is between the first and second trenches, forming a first source region in the substrate under the first trench, and forming a second source region in the substrate under the second trench. A continuous channel region of the substrate extends from the first source region, along a side wall of the first trench, along the portion of the upper surface that is between the first and second trenches, along a side wall of the second trench, and to the second source region.

A method of forming a twin bit memory cell, includes forming first and second trenches into an upper surface of a semiconductor substrate, wherein the first and second trenches are spaced apart from each other, forming a first floating gate of conductive material in the first trench and insulated from the substrate, forming a second floating gate of conductive material in the second trench and insulated from the substrate, forming a first erase gate of conductive material over and insulated from the first floating gate, forming a second erase gate of conductive material over and insulated from the second floating gate, forming a word line gate of conductive material over and insulated from a portion of the upper surface that is between the first and second trenches, forming a first source region at the upper surface of the substrate adjacent the first trench, and forming a second source region at the upper surface of the substrate adjacent the second trench. A continuous channel region of the substrate extends from the first source region, along a first side wall of the first trench, along a bottom wall of the first trench, along a second side wall of the first trench, along the portion of the upper surface that is between the first and second trenches, along a first side wall of the second trench, along a bottom wall of the second trench, along a second side wall of the second trench and to the second source region.

A method of forming a twin bit memory cell, includes forming first and second trenches into an upper surface of a semiconductor substrate, wherein the first and second trenches are spaced apart from each other, forming first and second floating gates of conductive material in the first trench spaced apart from each other and insulated from the substrate, forming third and fourth floating gates of conductive material in the second trench spaced apart from each other and insulated from the substrate, forming a first erase gate of conductive material over and insulated from the first and second floating gates, forming a second erase gate of conductive material over and insulated from the third and fourth floating gates, forming a word line gate of conductive material over and insulated from a portion of the upper surface that is between the first and second trenches, forming a first source region in the substrate under the first trench, forming a second source region in the substrate under the second trench, forming a first control gate of conductive material in the first trench, and between and insulated from the first and second floating gates, and forming a second control gate of conductive material in the second trench, and between and insulated from the third and fourth floating gates. A continuous channel region of the substrate extends from the first source region, along a side wall of the first trench, along the portion of the upper surface that is between the first and second trenches, along a side wall of the second trench, and to the second source region.

Other objects and features of the present invention will become apparent by a review of the specification, claims and appended figures.

DETAILED DESCRIPTION OF THE INVENTION

The present invention solves the above mentioned needs by forming two separate trenches into the surface of the substrate for a twin bit memory cell, and forming a floating gate in each trench.

Figure 1A:
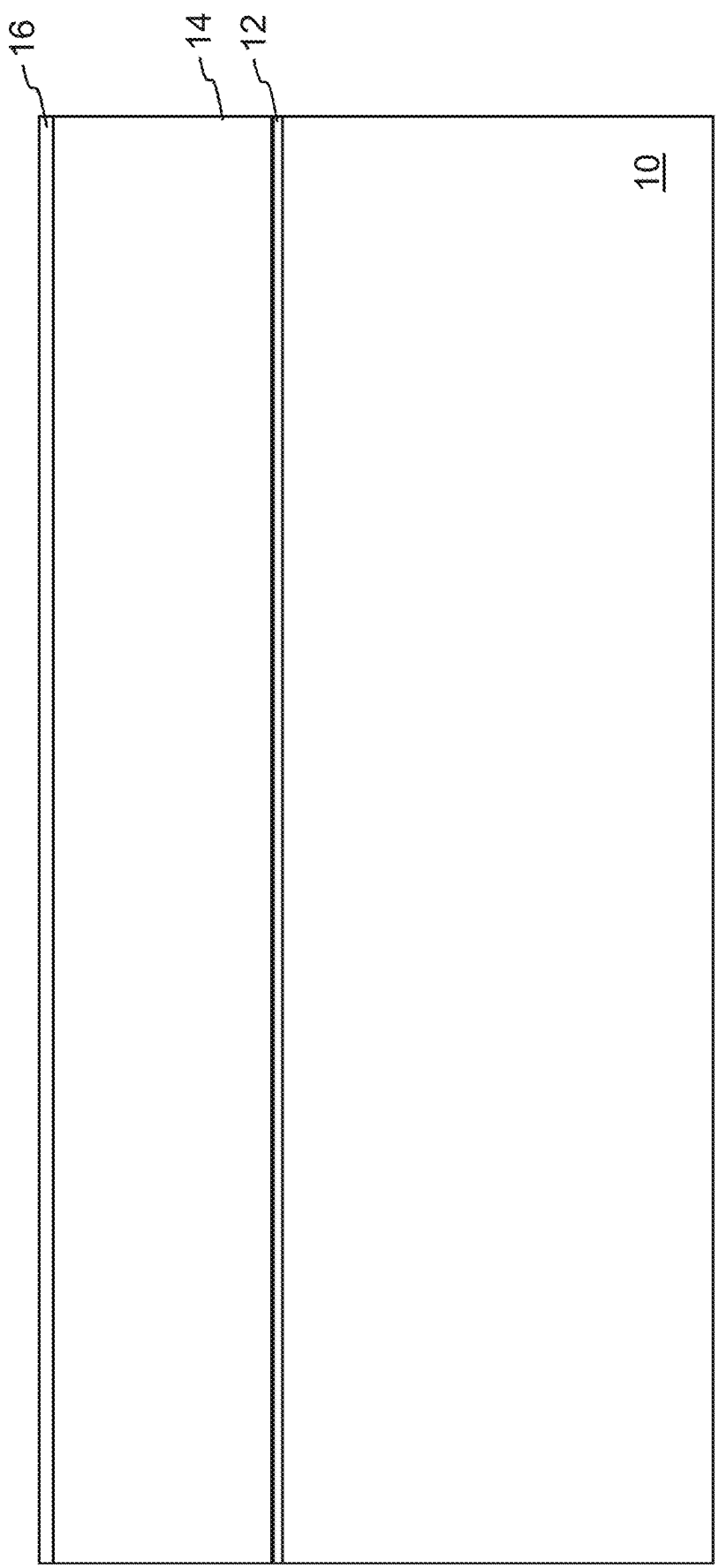
FIGS. 1A-1I are side cross sectional views illustrating the steps in forming the memory cells of the present invention.
Figure 1B:
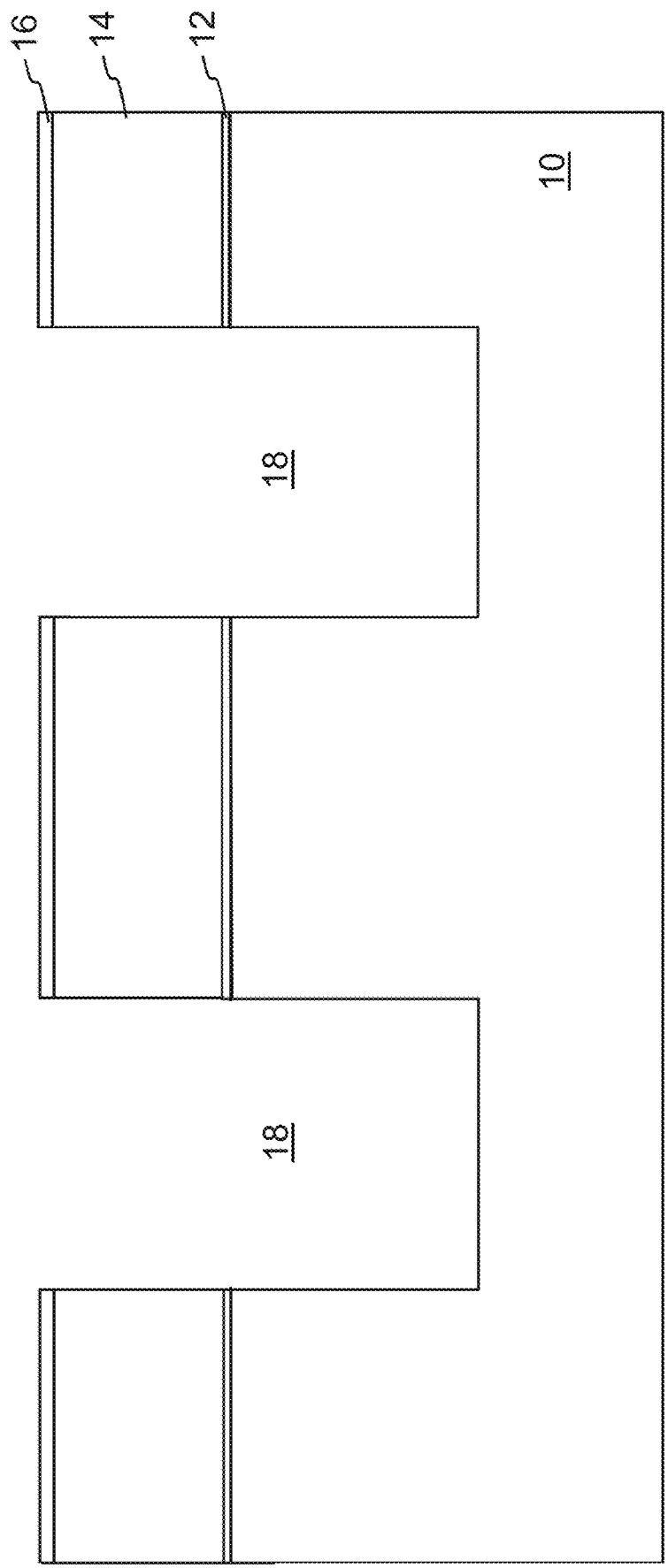

The formation of a twin bit memory cell starts with a semiconductor substrate 10. While only one is shown and described, it should be understood that an array of such twin bit memory cells would be formed on the same substrate 10 end to end. An oxide layer 12 is formed on the substrate. A nitride layer 14 is formed on the oxide layer 12, and an oxide layer 16 is formed on the nitride layer 14. The resulting structure is shown in FIG. 1A. A photolithography masking process is then formed to etch through the oxide layer 16, nitride layer 14, oxide layer 12 and into the substrate 10, forming a pair of spaced apart trenches 18. The masking step includes forming a layer of photo resist on the oxide layer 16, and selectively exposing portions of the photo resist. Selected portions of the photo resist are removed, leaving portions of the oxide layer 16 exposed. One or more etches are performed to remove the exposed portions of the oxide layer 16, and the underlying portions of the nitride layer 14, oxide layer 12 and substrate 10. The resulting structure is shown in FIG. 1B (after removal of the photo resist).

Figure 1C:
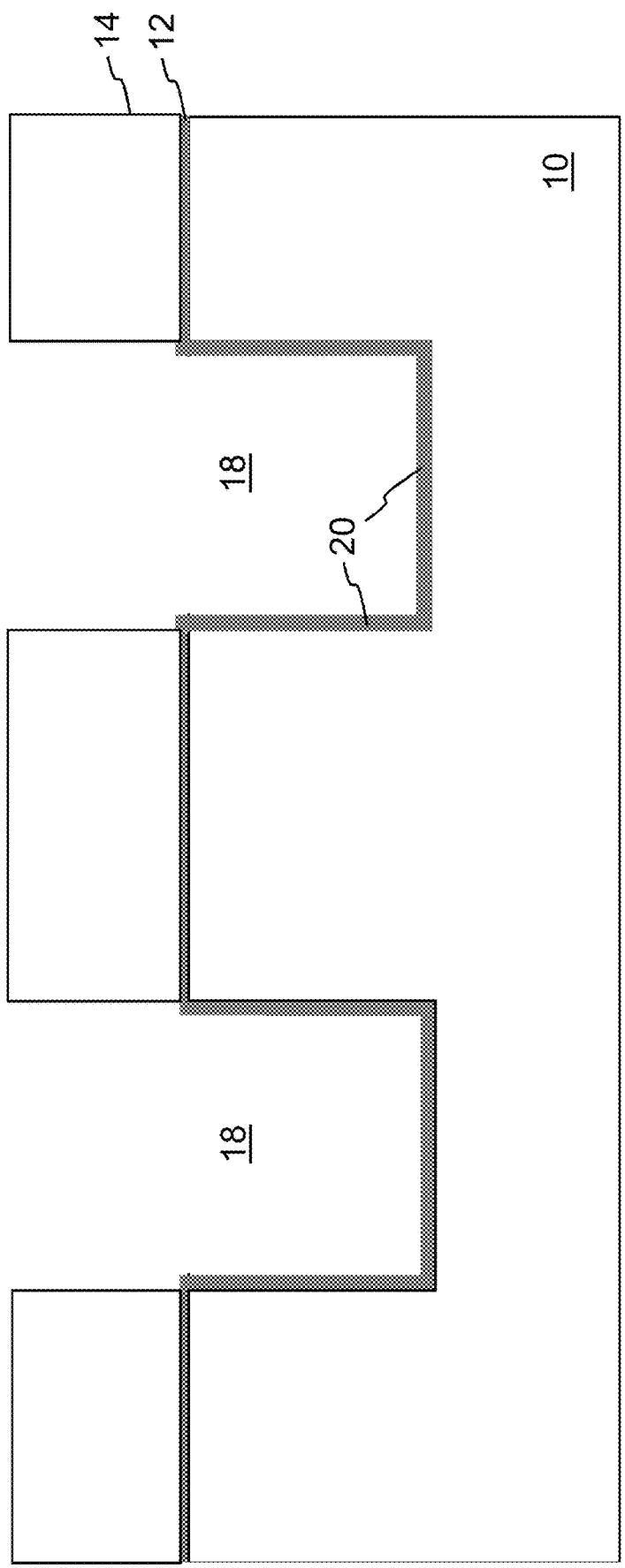
Figure 1D:
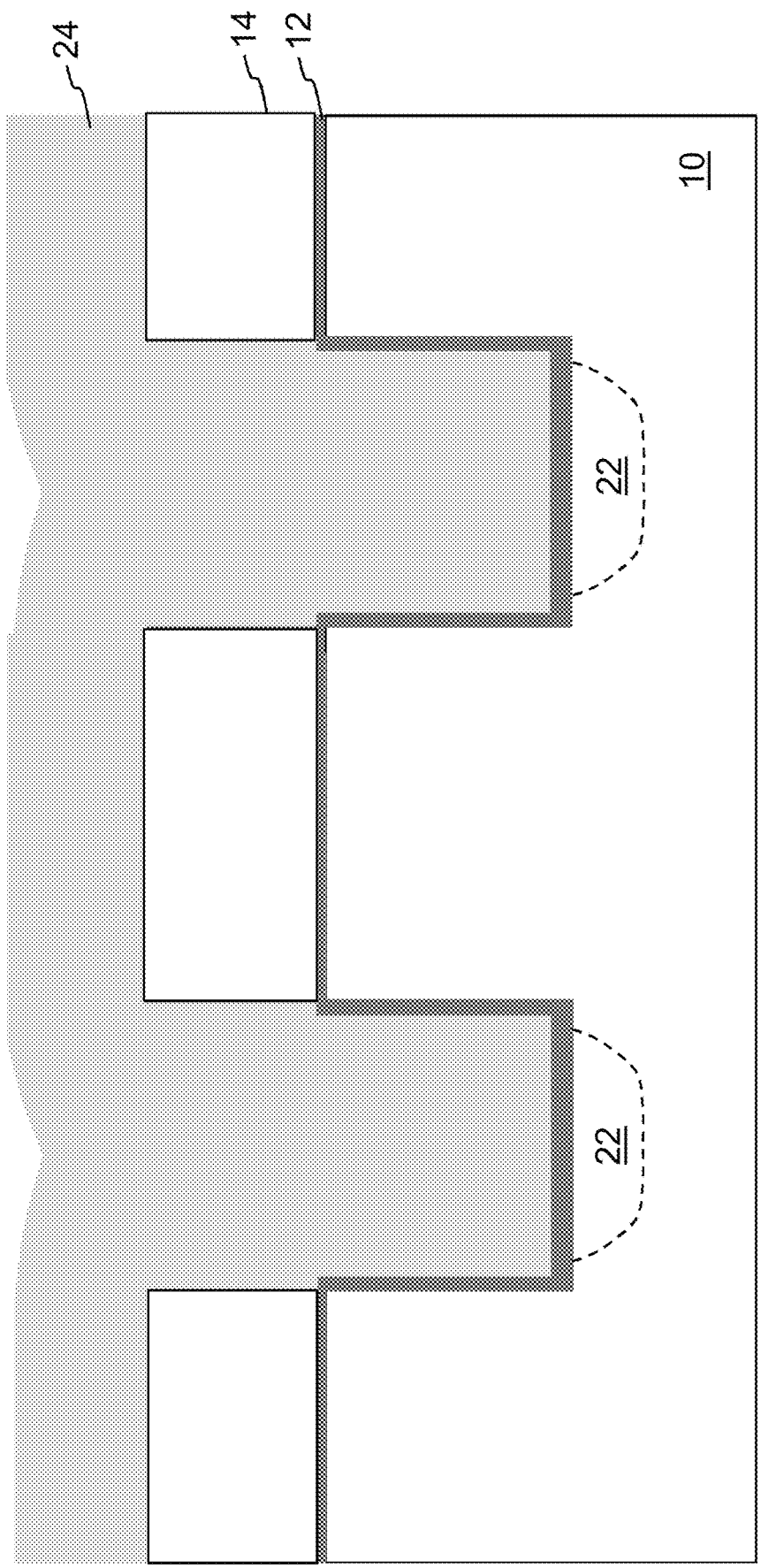
Figure 1E:
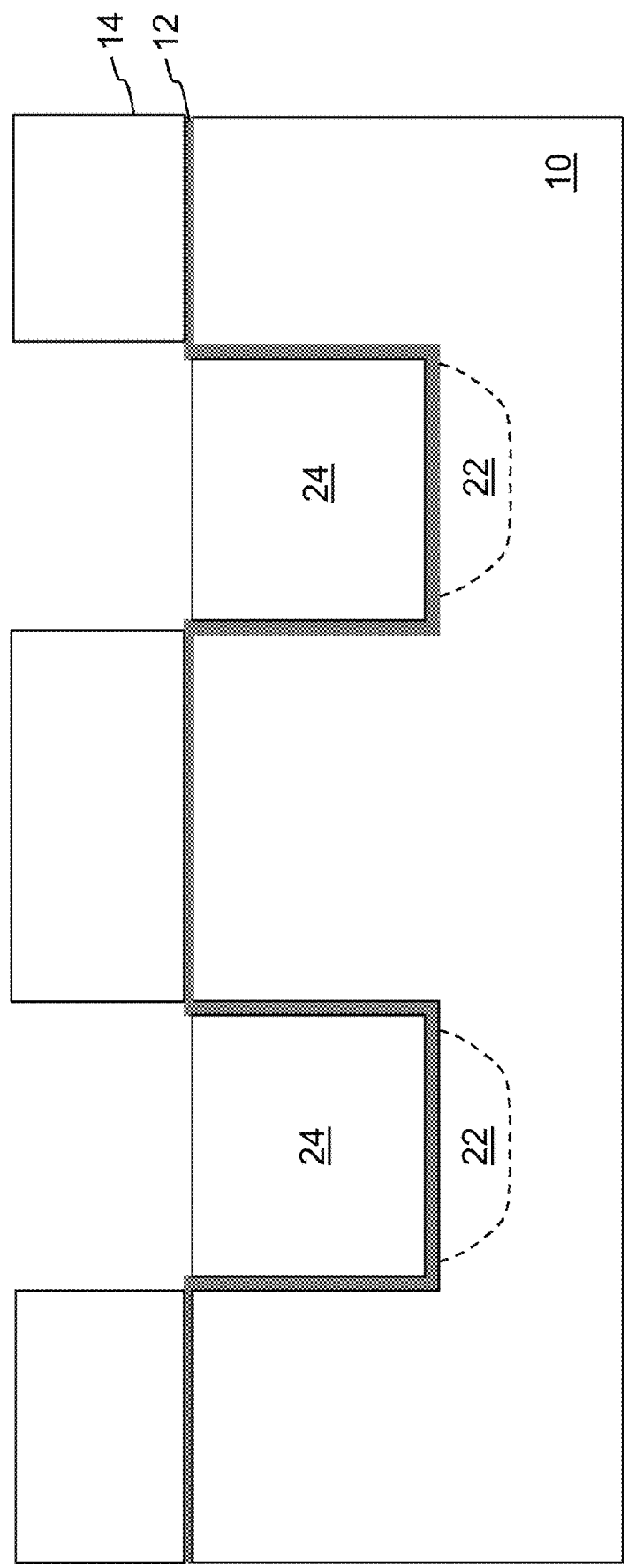

An oxide etch is used remove oxide layer 16, and an oxide formation step is performed (e.g., thermal oxidation) to form oxide layer 20 on the exposed silicon substrate surfaces of trenches 18, as shown in FIG. 1C. An implantation process is performed to form a source region 22 (i.e. a region having a second conductivity type different than the first conductivity type of the substrate) in the substrate portion underneath each trench 18. A layer of polysilicon 24 is then deposited over the structure, filling each trench 18 with polysilicon 24, as shown in FIG. 1D. The portions of polysilicon 24 above the surface of the substrate are removed (e.g., by CMP and etch back), leaving blocks of poly 24 in the substrate portion of trenches 18. The upper surfaces of poly blocks 24 can be even with the upper surface of the substrate, or the etch back can be adjusted so that the upper surfaces of poly blocks 24 are above the substrate surface (i.e., the poly blocks 24 have an upper portion extending above the level of the substrate), or below the substrate surface (i.e., the poly blocks do not fully fill the portion of the trenches formed in the substrate). Preferably, the upper surfaces of the poly blocks 24 are substantially even with the substrate surface as shown in FIG. 1E.

Figure 1F:
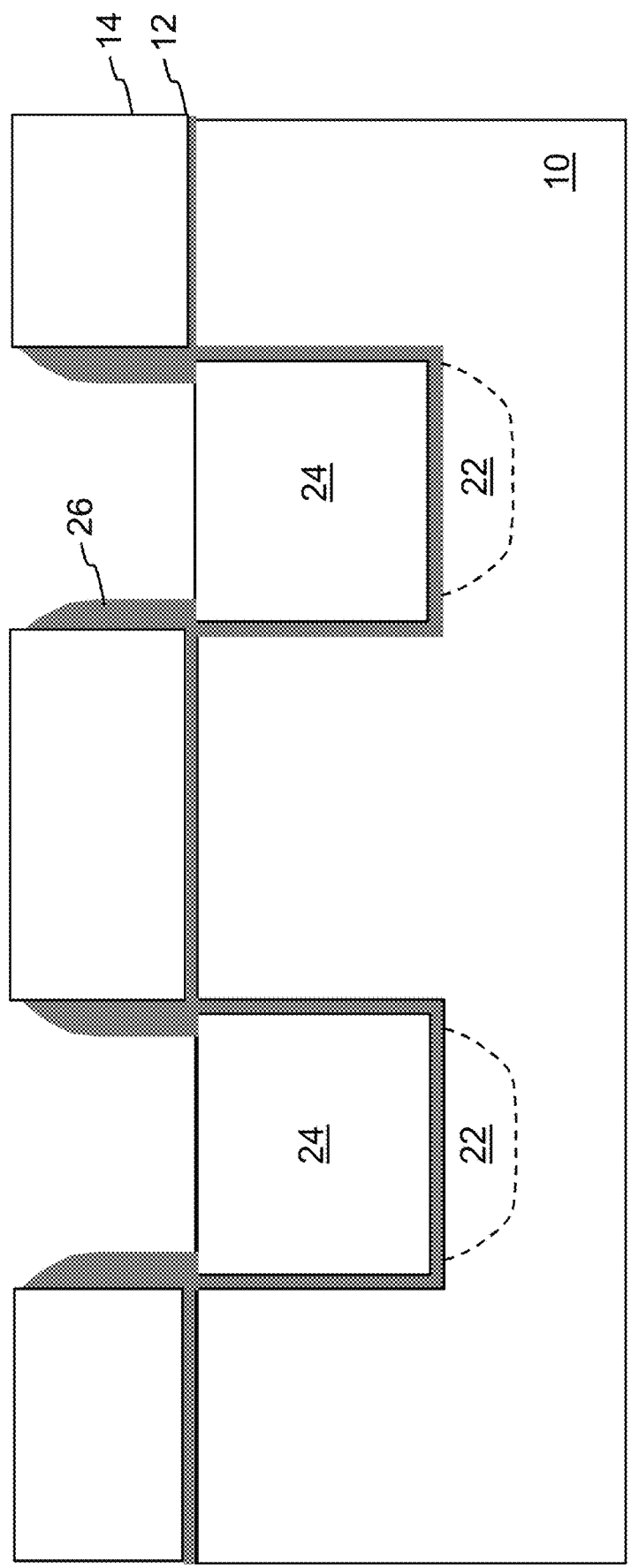
Figure 1G:
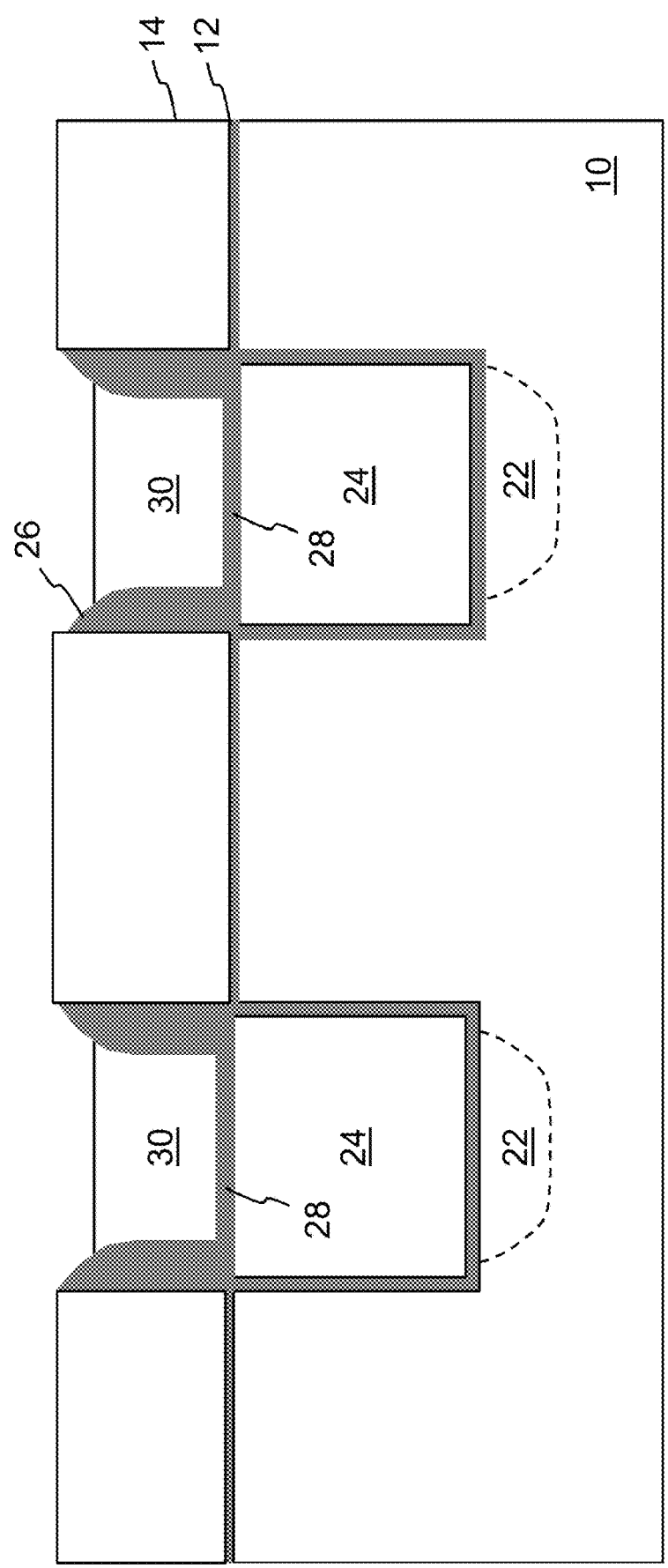
Figure 1H:
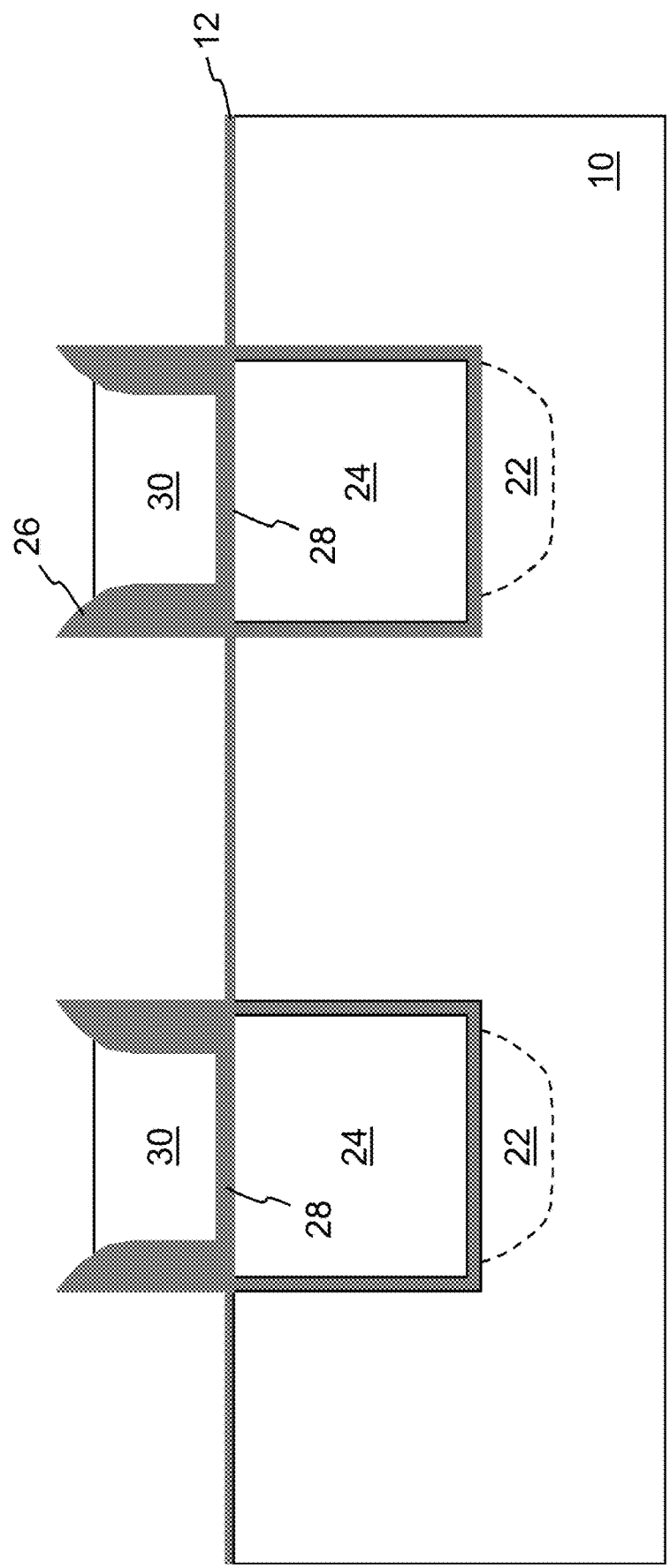

Oxide spacers 26 are formed along the nitride sidewalls of trenches 18 by depositing a layer of oxide, following by an oxide etch, leaving spacers 26 of the oxide, as shown in FIG. 1F. Formation of spacers is well known in the art, and includes forming a conformal layer of material over a structure, followed by an etch that removes the material except for those portions along vertically oriented structural features. An oxide formation step (e.g., thermal oxidation) is then used to form a layer of oxide 28 on the exposed upper surfaces of poly blocks 24. A polysilicon layer is formed over the structure, and partially removed (e.g., CMP and etch back), leaving blocks of polysilicon 30 disposed on oxide layer 28 and between spacers 26, as shown in FIG. 1G. Nitride 14 is then removed by a nitride etch, as shown in FIG. 1H. A layer of polysilicon is formed over the structure, which is partially removed by CMP, leaving poly blocks 32 disposed between the back sides of spacers 26 (i.e., spacers 26 are disposed between poly blocks 30 and 32). A word line 34 and word line contacts 36 are formed (e.g. of a metal material) to electrically connect the poly blocks 32 together. The final structure is shown in FIG. 1I.

Figure 1I:
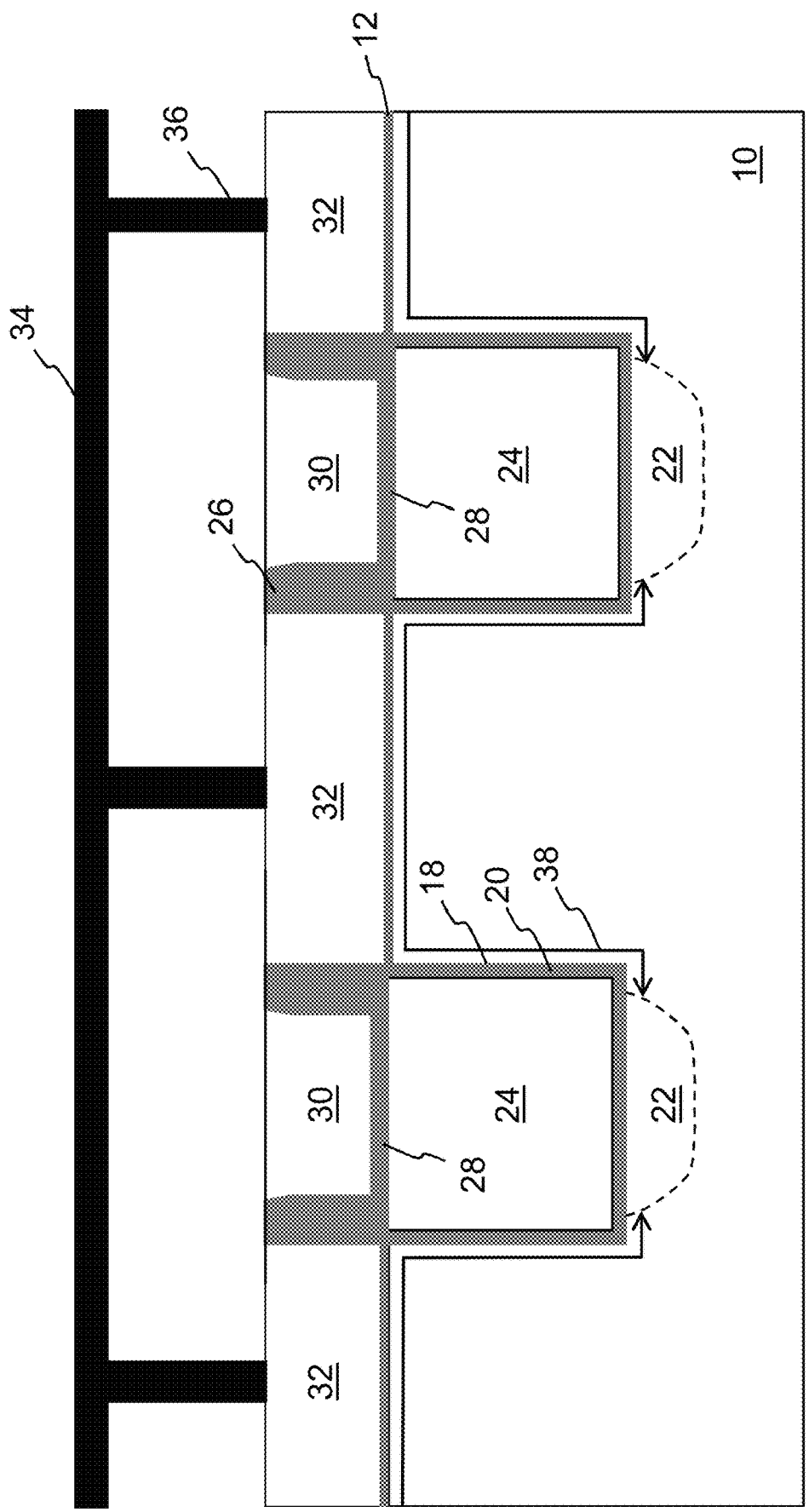

As shown in FIG. 1I, the twin bit memory cell includes a pair of floating gates 24 in trenches 18 and are insulated from the substrate by oxide 20. The upper surfaces of the floating gates are preferably even with the upper surface of substrate 10, but could extend above the height of the substrate upper surface, or be disposed below the surface of the substrate, if desired. An erase gate 30 is disposed over and insulated from each of the floating gates 24. A word line gate 32 is disposed between the erase gates 30, and is disposed over and insulated from the substrate. The twin bit memory cell also includes a channel region 38 of the substrate that extends from the source region 22 under one of the floating gates 24, along a sidewall of that trench 18, along the surface of the substrate, along a sidewall of the other trench 18, and to the source region 22 under the other floating gate 24. The conductivity of the portions of the channel region along the trenches are controlled by the floating gates 24. The conductivity of the portion of the channel region along the surface of the substrate 10 is controlled by the word line gate 32. Programming of the floating gates is enhanced because the horizontal portion of the channel region is aimed at the floating gate, which enhances hot electron injection. Miniaturization of the twin bit memory cell pair is achieved because each trench contains only a single floating gate, where the dimensions of the floating gate are dictated by the trench dimensions, the channel region is folded to extend downwardly into the substrate instead of extending entirely along the substrate surface, and no drain region is required, reducing cell height and cell lateral dimensions.

The twin bit memory cell can store a bit of information in each floating gate. The cell operation is as follows. To program the right hand floating gate, the erase gates 30 are both placed at a positive voltage, such as 4.5 volts, which is coupled to the floating gates 24. The word line gate 32 is placed at a positive voltage, such as 1 volt, to turn on the underlying channel region portion. A positive voltage is placed on the right hand source region 22, and a current of around 1 µA is supplied to the left hand source region 22. Electrons from the left hand source region 22 will travel along the channel region portion adjacent the left hand floating gate (which is turned on by the coupled positive voltage from the left hand erase gate), along the channel region portion under the word line gate 32, until the electrons see the positive voltage coupled onto the right hand floating gate, where some electrons are deposited onto the right hand floating gate through hot electron injection. Programming the left hand floating gate is performed the same way, but reversing the voltages and current. To erase the floating gates (i.e., remove electrons therefrom), a high voltage (e.g., 11.5 volts) is applied to the erase gates 30, where electrons tunnel from the floating gates to the erase gates via Fowler-Nordheim tunneling. To read the right hand floating gate, a positive voltage (e.g., Vcc) is applied to the word line gate 32 to turn on that portion of the channel region. A positive voltage is applied to the left hand erase gate 30 (which is coupled to the left hand floating gate to turn on that portion of the channel region). A positive voltage is applied to the left hand source region (e.g., 0.6-1 volt). A small positive voltage is supplied to the right hand erase gate, which is coupled to the right hand floating gate. This coupled voltage is high enough to turn on the channel region adjacent the right hand floating gate only if the floating is erased of electrons. Current is supplied to the right hand source region. If current flows along the channel region, then the right hand floating gate is read to be in its erased state. If low or no current flows along the channel region, then the right hand floating gate is read to be in its programmed state. Reading the left hand floating gate is performed the same way, but reversing the voltages and current. These operations are performed without the need for a third source/drain region between the floating gates using multiple channel regions, and instead are performed using a single continuous channel region extending from one source region to another source region.

Figure 2A:
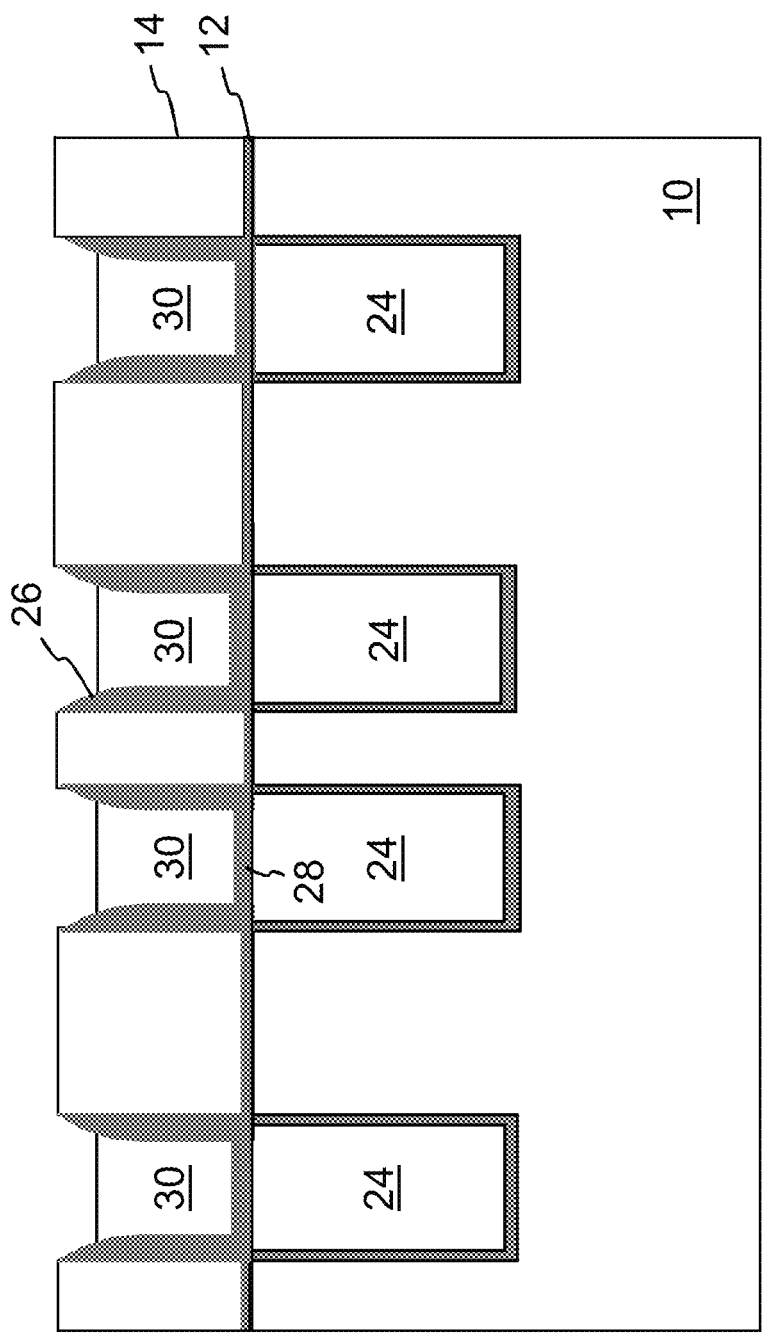
FIGS. 2A-2C are side cross sectional views illustrating the steps in forming the memory cells of a second embodiment of the present invention.
Figure 2B:
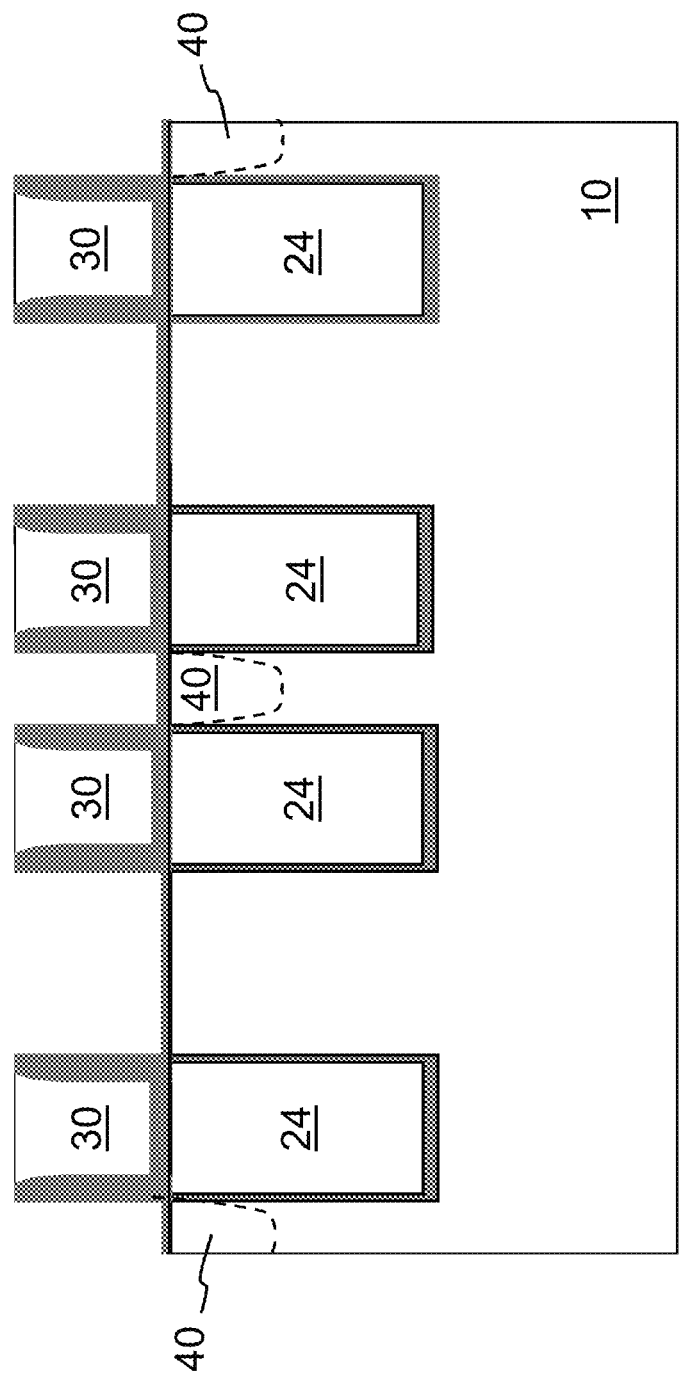
Figure 2C:
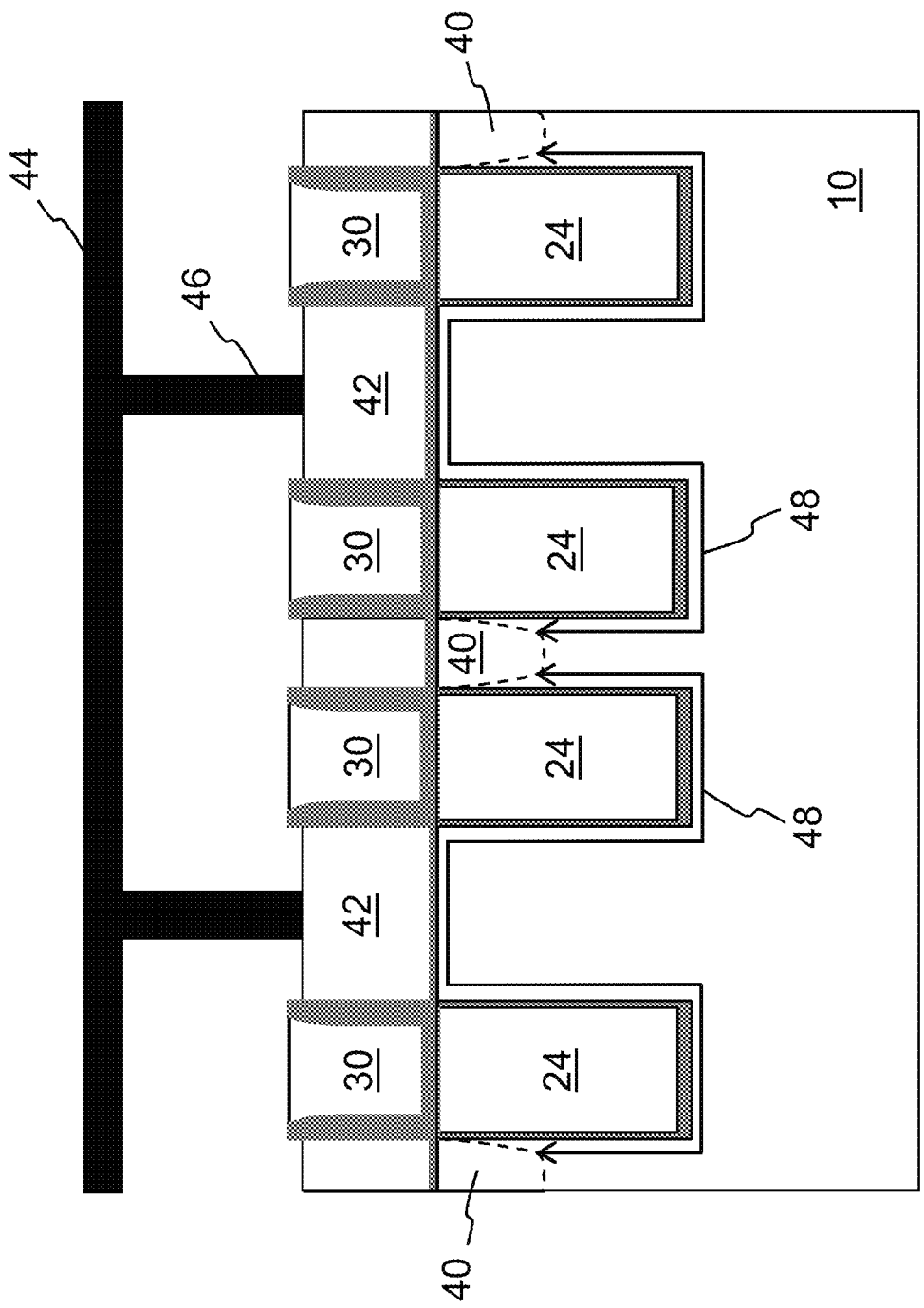

FIGS. 2A-2C illustrate the formation of another embodiment. The formation of this embodiment starts with the same structure shown in FIG. 1G, except no source regions 22 are formed under the trenches, as shown in FIG. 2A. Nitride 14 is removed by nitride etch. Source regions 40 are then formed by photolithographic and implantation steps into the surface portion of the substrate adjacent alternate pairs of floating gates 24, as shown in FIG. 2B. A layer of polysilicon is formed over the structure, which is partially removed by CMP, leaving poly blocks 42 disposed between the back sides of spacers 26 (i.e., spacers 26 are disposed between poly blocks 30 and 42). A word line 44 and word line contacts 46 are formed (e.g. of a metal material) to electrically connect the poly blocks 42 together. The final structure is shown in FIG. 2C.

As shown in FIG. 2C, the twin bit memory cell is similar to that of FIG. 1I, except the source regions 40 are formed at the substrate surface, instead of being disposed underneath the floating gates. The channel regions 48 still extend along the trenches and substrate surface. Therefore the twin bit memory cell is programmed, erased and read in a manner similar to that described with respect to FIG. 1I.

Figure 2D:
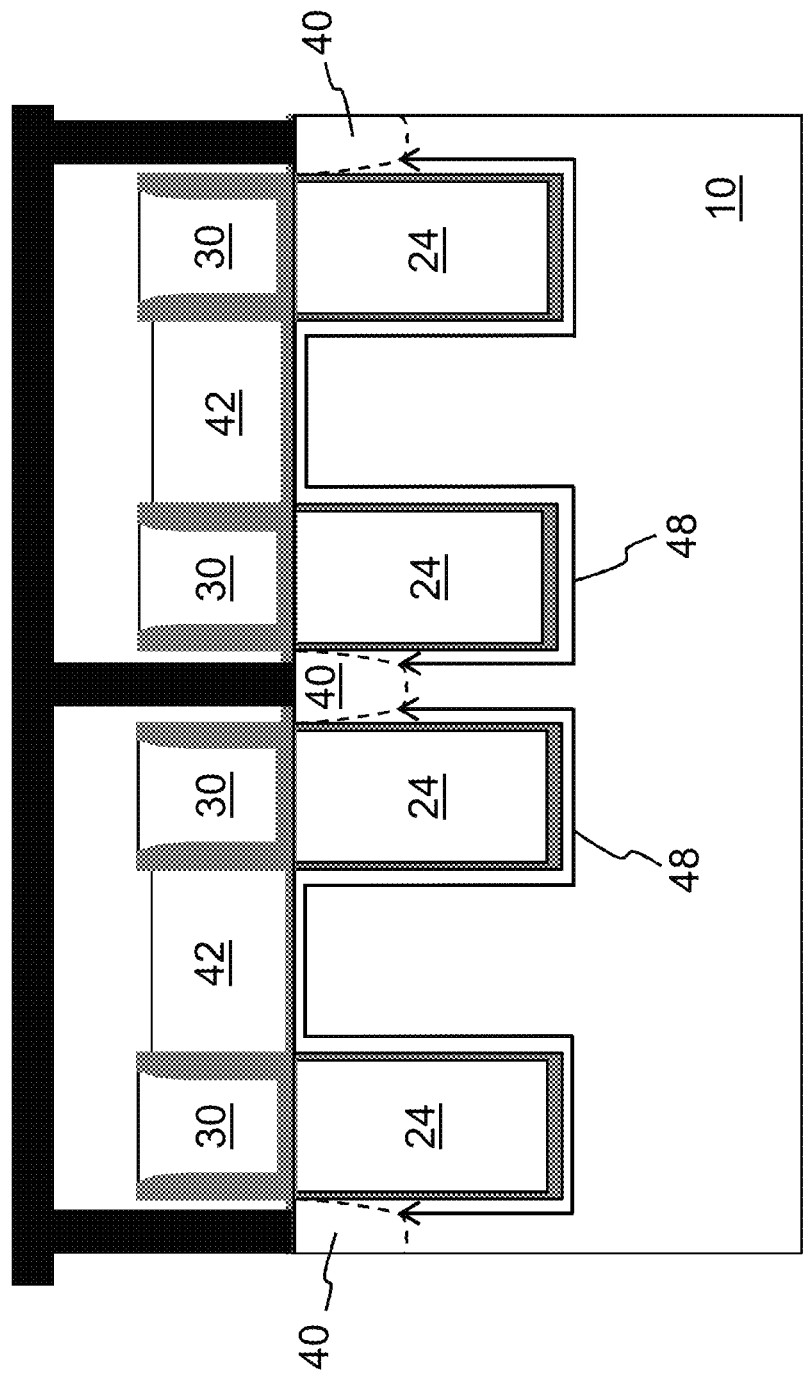
FIG. 2D is a side cross sectional view illustrating a modification to the second embodiment of the present invention.

FIG. 2D illustrates an optional modification to the second embodiment. The twin bit memory cell is the same as that shown in FIG. 2C, except that the poly block and oxide layer over the source region 40 is removed. A bit line contact 48 is formed that extends between and electrically connects the source regions 40 to a conductive bit line 49.

Figure 3A:
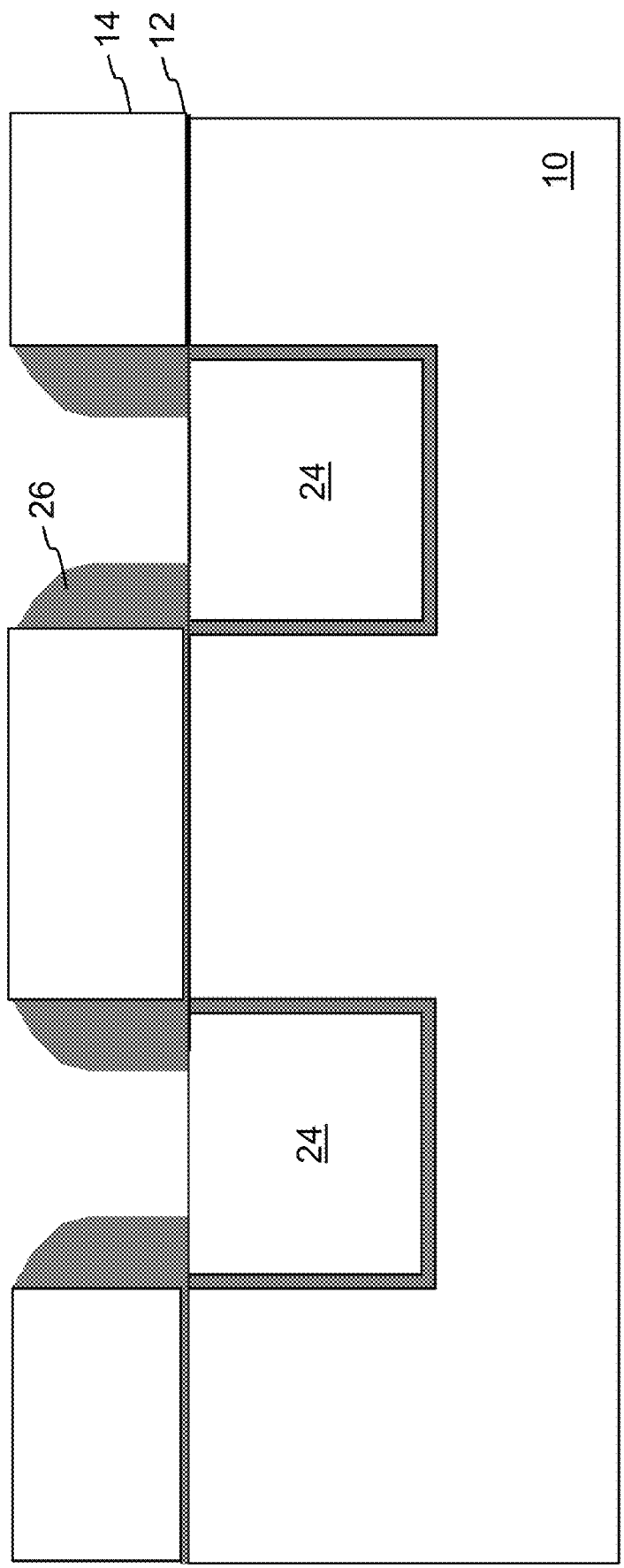
FIGS. 3A-3H are side cross sectional views illustrating the steps in forming the memory cells of a third embodiment of the present invention.
Figure 3B:
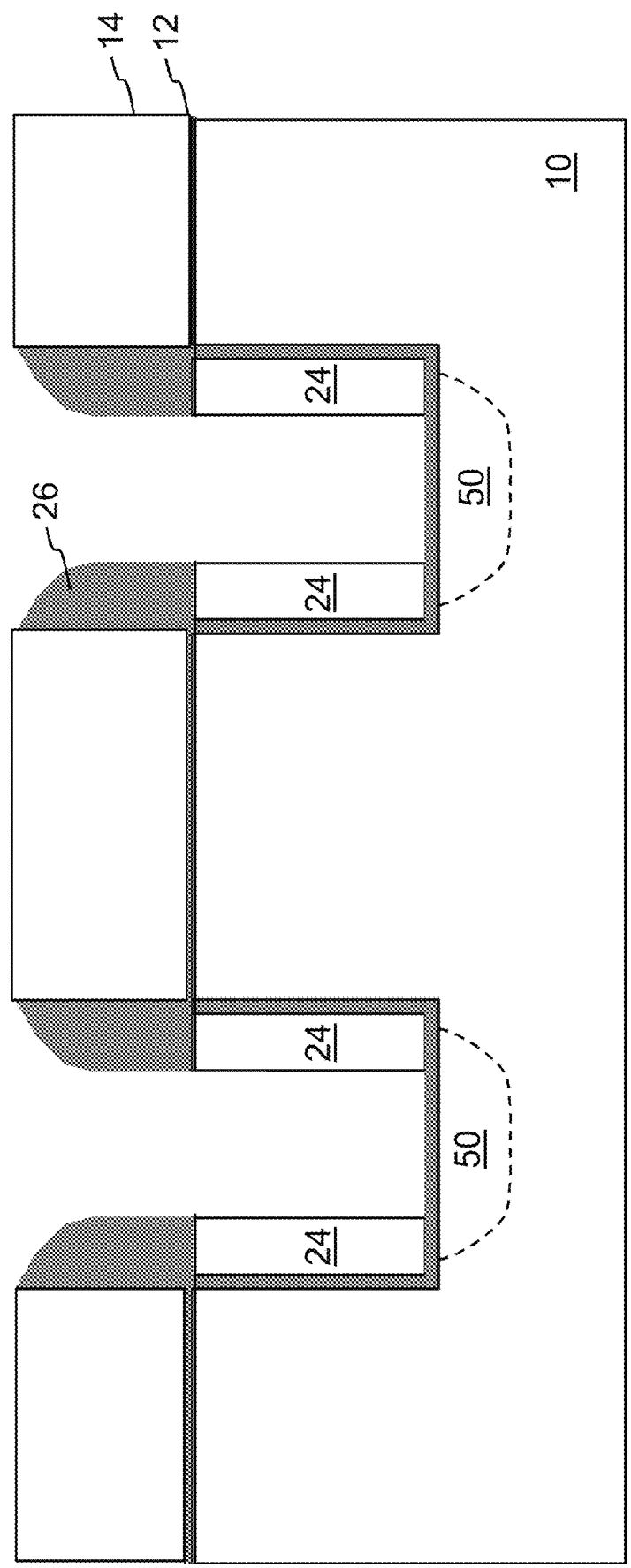
Figure 3C:
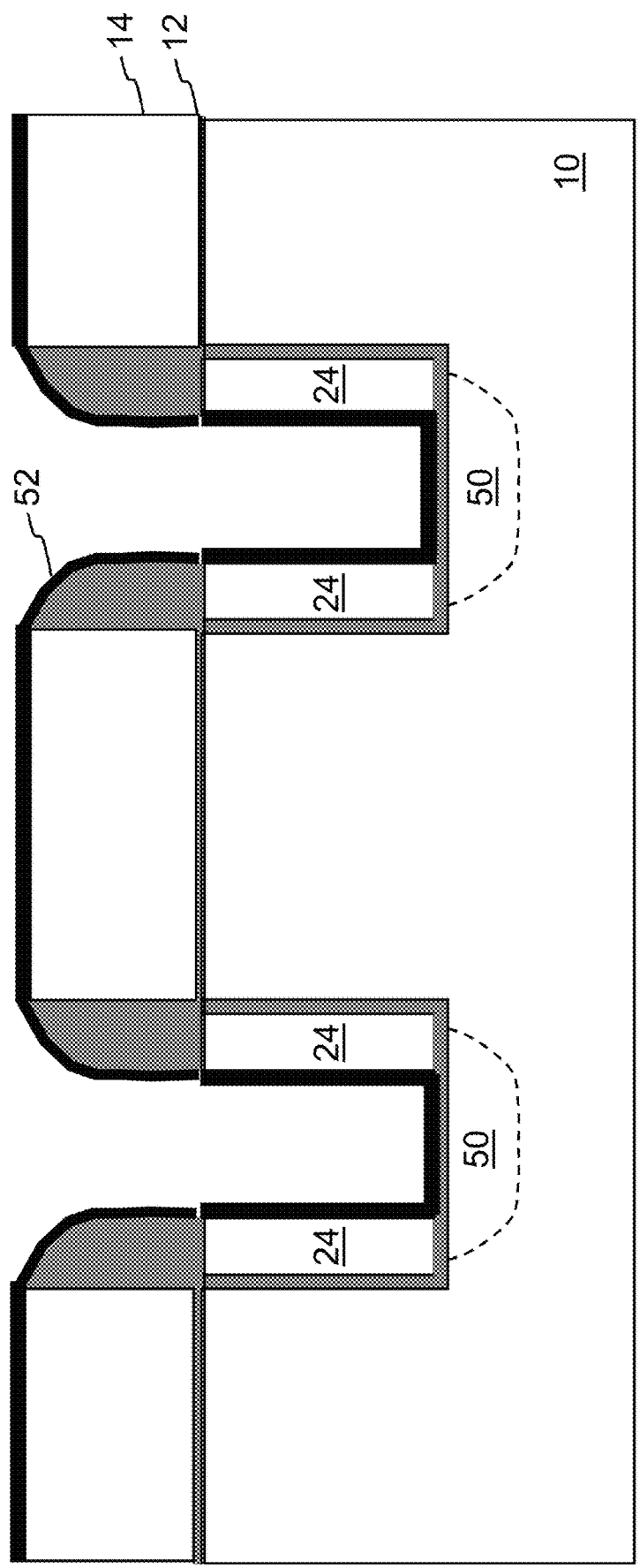
Figure 3D:
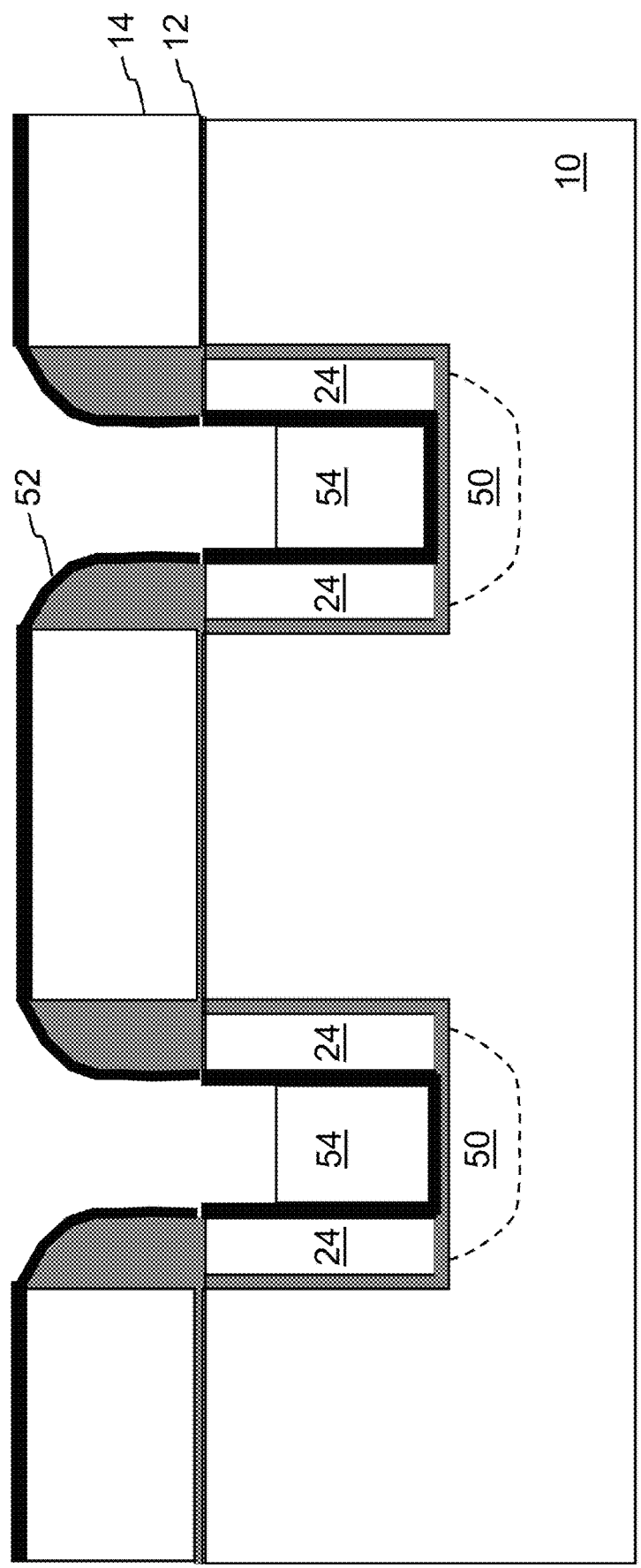
Figure 3E:
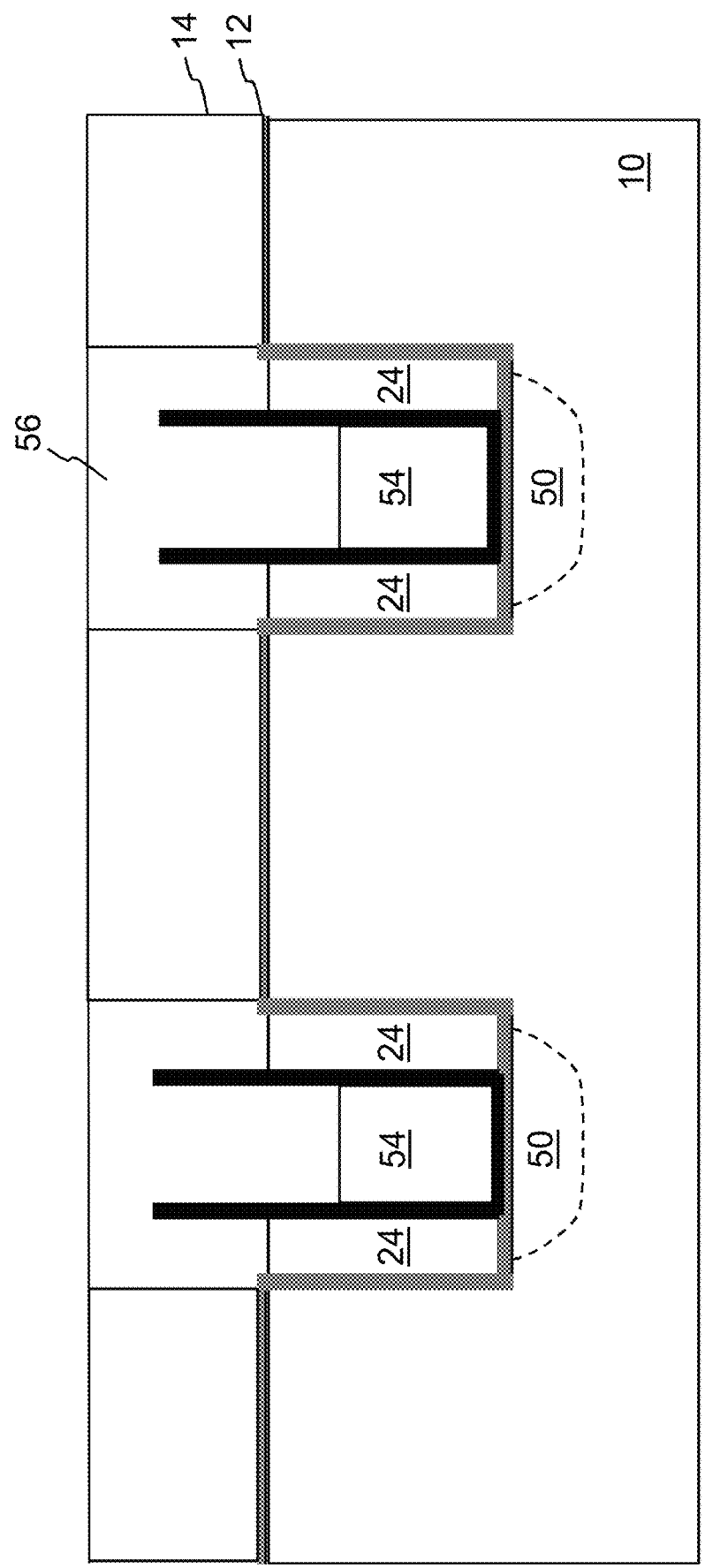
Figure 3F:
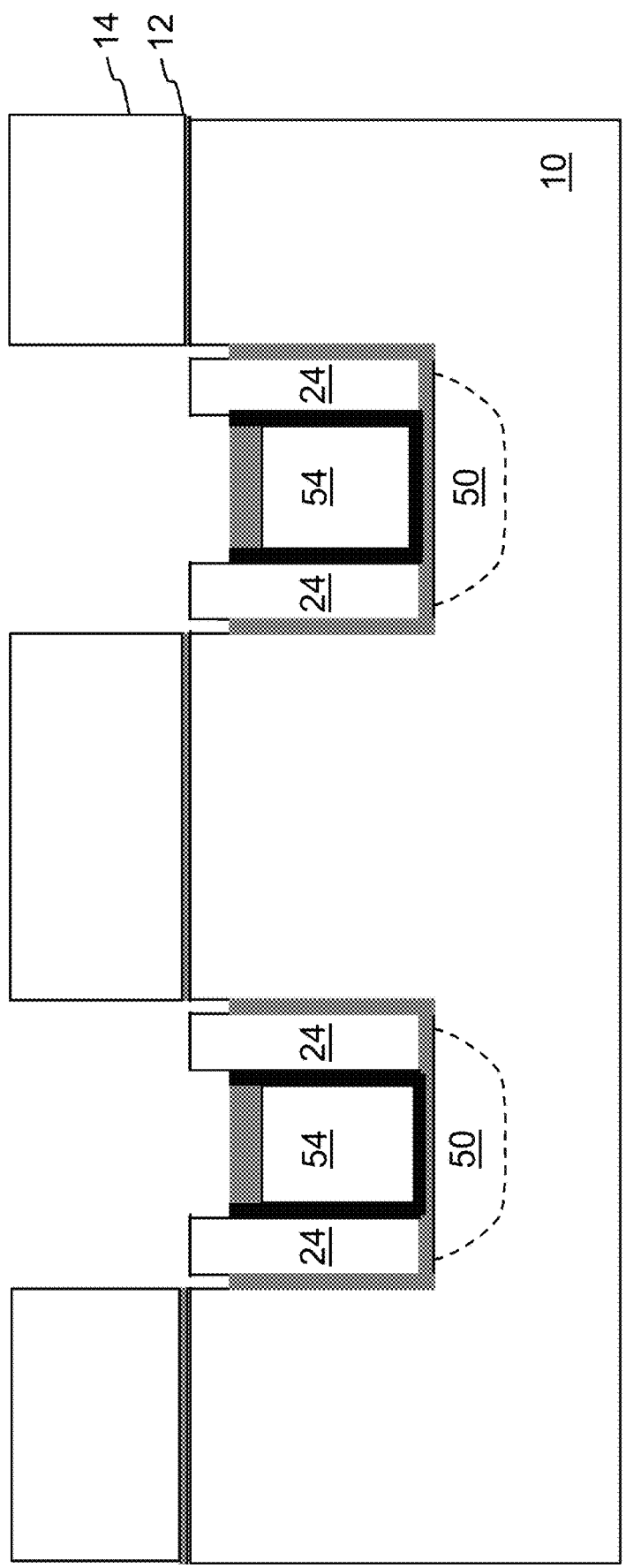
Figure 3G:
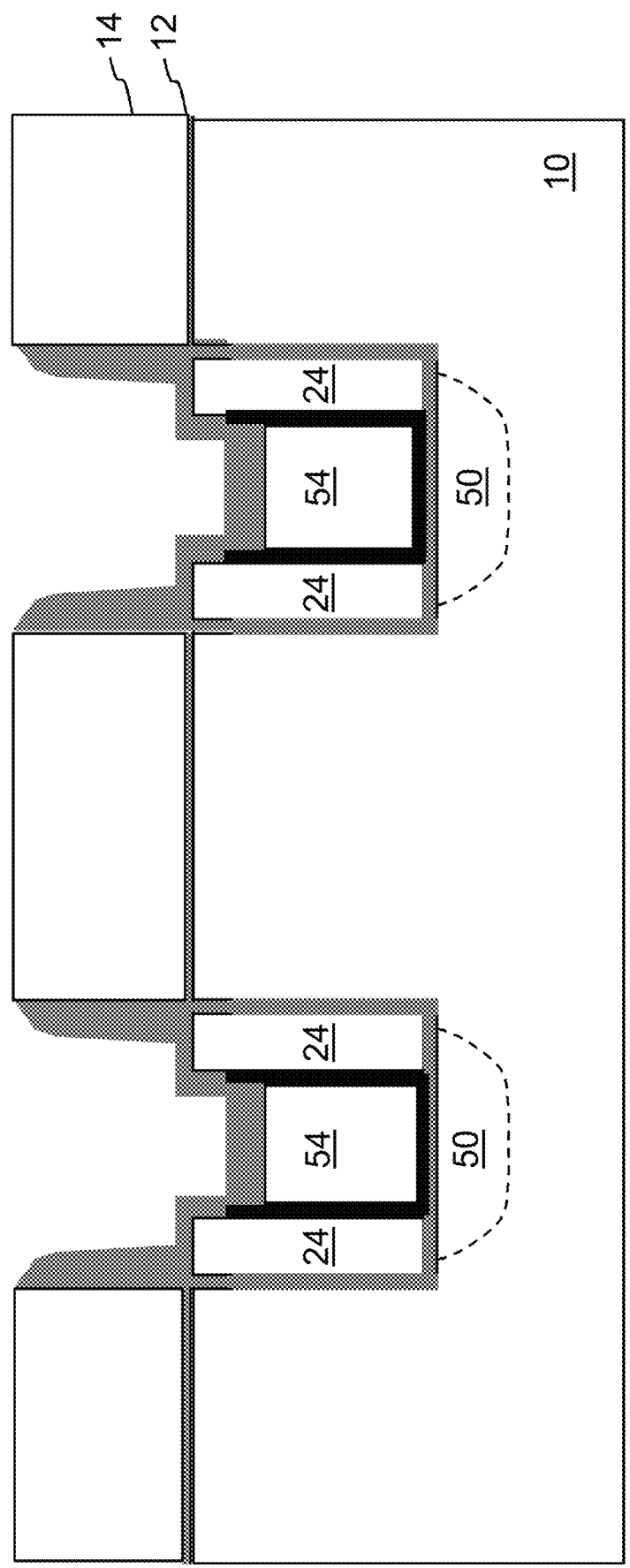
Figure 3H:
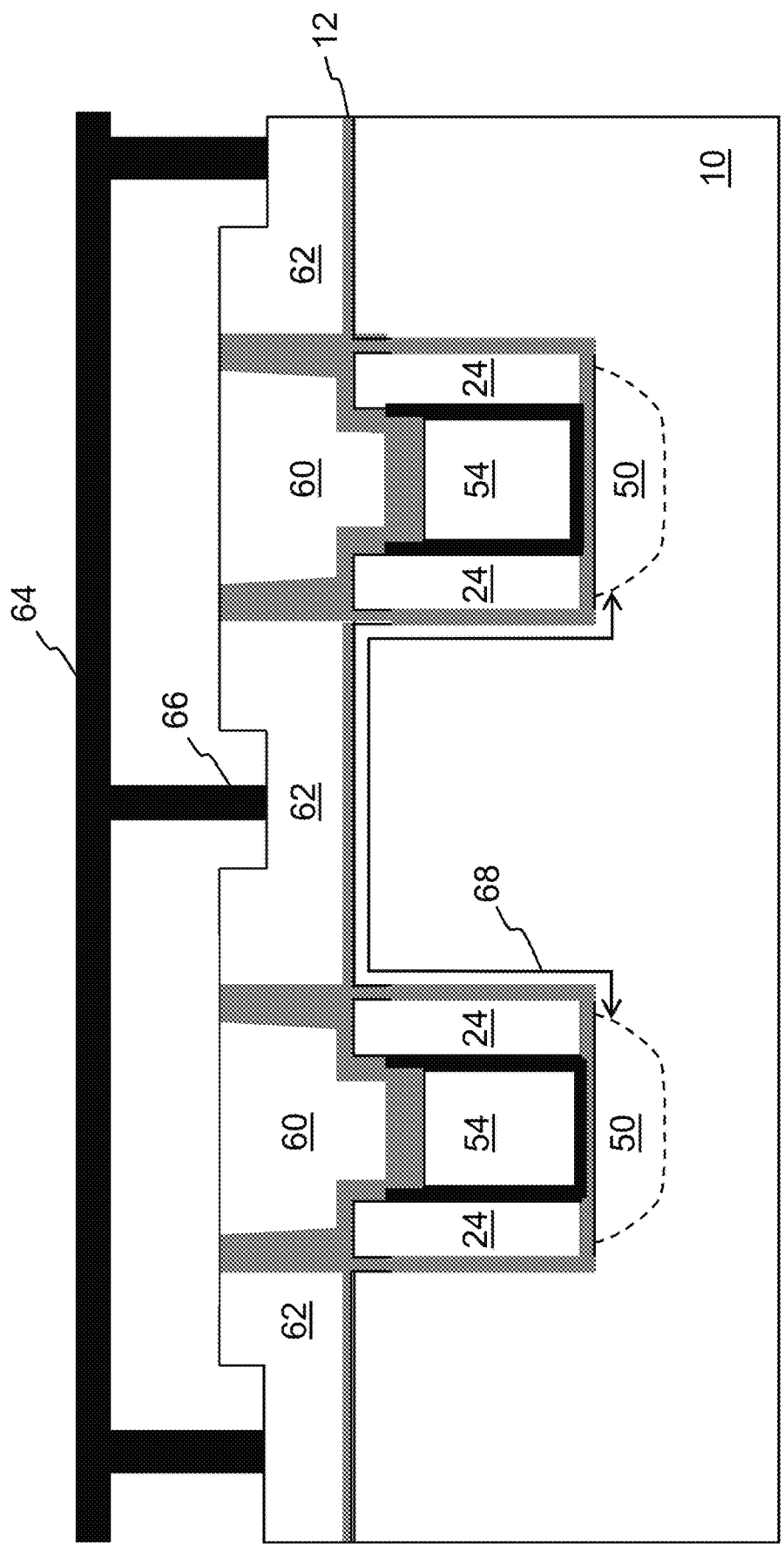

FIGS. 3A-3H illustrate the formation of another embodiment. The formation of this embodiment starts with the same structure shown in FIG. 1F, except without the formation of the source regions, as shown in FIG. 3A. An anisotropic poly etch is performed to remove the exposed portions of poly blocks 24 between spacers 26, leaving two separate poly blocks 24 in each trench. An implantation process is then performed to form a source region 50 under each trench, as shown in FIG. 3B. An insulation layer 52 is formed over the structure, as shown in FIG. 3C. Preferably, insulation layer 52 is an ONO layer, meaning it has oxide, nitride, oxide sublayers. A poly deposition and etch process (e.g., CMP and etch back) is performed to form poly blocks 54 in the bottom of trenches 18, as shown in FIG. 3D. Oxide is deposited over the structure, followed by CMP oxide removal, which fills the trenches with oxide 56, as shown in FIG. 3E. An oxide etch is performed to remove the oxide in the top portions of the trenches, to expose the top portions of poly blocks 24, as shown in FIG. 3F. An oxide deposition and etch is used to form oxide layer 58 and oxide spacer 59 over each of the exposed portions of poly blocks 24, as shown in FIG. 3G. Nitride layer 14 is removed by nitride etch. A poly deposition and CMP is performed to form poly blocks 60 over poly blocks 54, and poly blocks 62 on oxide 12 over the substrate surface. A word line 64 and word line contacts 66 are formed (e.g. of a metal material) to electrically connect the poly blocks 62 together. The final structure is shown in FIG. 3H.

As shown in FIG. 3H, each trench includes two floating gates 24, each one being for a different twin bit memory cell. Poly block 54 serves as a control gate disposed in the trench and between floating gates of different twin bit memory cells. The erase gate is disposed over the floating gates in each trench, with a lower narrower portion that extends into the trench, and a wider upper portion that extends up and over the floating gates, so that the erase gate wraps around the upper edges of the floating gates for enhanced Fowler Nordheim tunneling efficiency. The channel region 68 extends between source regions 50, along the trench sidewalls and along the substrate surface. Cell size is reduced by forming the floating gates in trenches with non-linear channel regions, by not having a separate drain region, and operating the memory cell as a twin bit cell as opposed to two separately operating memory cells.

The twin bit memory cell of this embodiment operates similarly to the other two embodiments described above. To program the right hand floating gate, the erase gates 30 are both placed at a positive voltage, such as 4.5 volts, which are coupled to the floating gates 24. The word line gate 62 is placed at a positive voltage, such as 1 volt, to turn on the underlying channel region portion. A positive voltage is applied to the left hand control gate 54, which is coupled to the left hand floating gate to turn on that portion of the channel region. A positive voltage is placed on the right hand source region 50, and a current of around 1 μA is supplied to the left hand source region 54. A positive voltage may be applied to the right hand control gate. Electrons from the left hand source region 54 will travel along the channel region portion adjacent the left hand floating gate (which is turned on by the coupled positive voltage to the left hand floating gate), along the channel region portion under the word line gate 62, until they see the positive voltage coupled onto the right hand floating gate from the erase gate and/or control gate, where some electrons are deposited on the right hand floating gate through hot electron injection. Programming the left hand floating gate is performed the same way, but reversing the voltages and current. To erase the floating gates (i.e., remove electrons therefrom), a high voltage (e.g., 11.5 volts) is applied to the erase gates 60, where electrons tunnel from the floating gates to the erase gates via Fowler-Nordheim tunneling. To read the right hand floating gate, a positive voltage (e.g., Vcc) is applied to the word line gate 62. A positive voltage is applied to the left hand erase gate 60 and/or left hand control gate 54 (which is coupled to the left hand floating gate to turn on that portion of the channel region). A positive voltage is applied to the left hand source region (e.g., 0.6-1.1 volt). A small positive voltage is supplied to the right hand erase gate and/or right hand control gate, which is coupled to the right hand floating gate. This voltage is high enough to turn on the channel region adjacent the right hand floating gate only if the floating is erased of electrons. Current is supplied to the right hand source region. If current flows along the channel region, then the right hand floating gate is read to be in its erased state. If low or no current flows along the channel region, then the right hand floating gate is read to be in its programmed state. Reading the left hand floating gate is performed the same way, but reversing the voltages and current.

Figure 4:
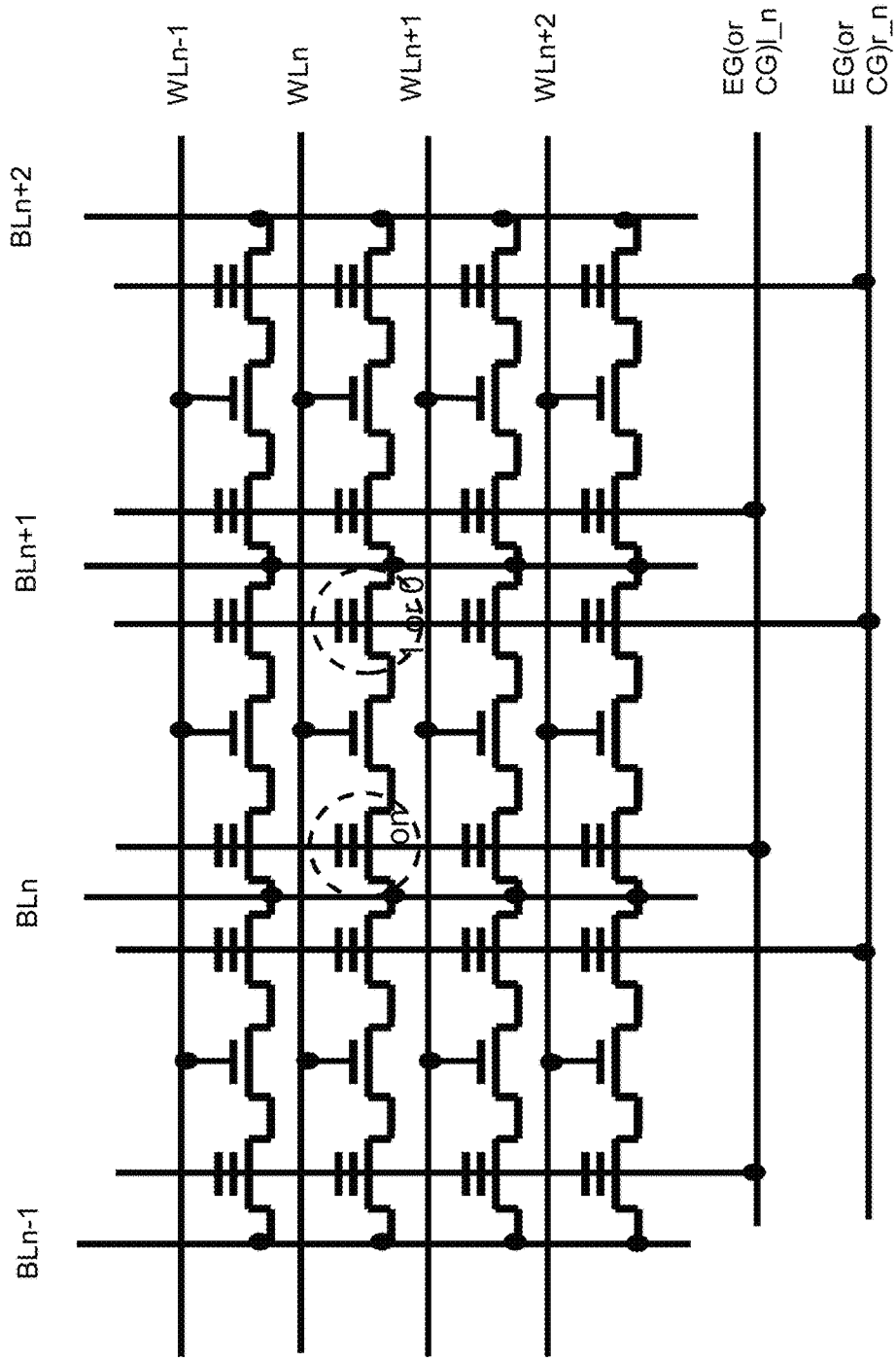
FIG. 4 is the schematic diagram of an array of the twin bit memory cells of FIGS. 1I, 2C and 3H.

FIG. 4 is the schematic diagram of an array of the twin bit memory cells of FIGS. 1I, 2C and 3H. The operational voltages and currents for such an array is illustrated in Table 1 below.

TABLE 1

|  | WL_n | UnSel WLs | EG (or CG) l_n | EG (or CG) r_n | UnSel EG (or CG)s | BLn | BLn + 1 | UnSel BLs |
|---|---|---|---|---|---|---|---|---|
| Read | 2.5 | 0 | >2.5 | 0 | 0 | 0.6~1.1 | 0 | 0 |
| Erase | 0 | 0 | 11.5 | 11.5 | 0 | 0 | 0 | 0 |
| Program | 1.0 | 0 | 4.5 | 4.5 | 0 | 1 uA | 4.5 | 0 |

Figure 5:
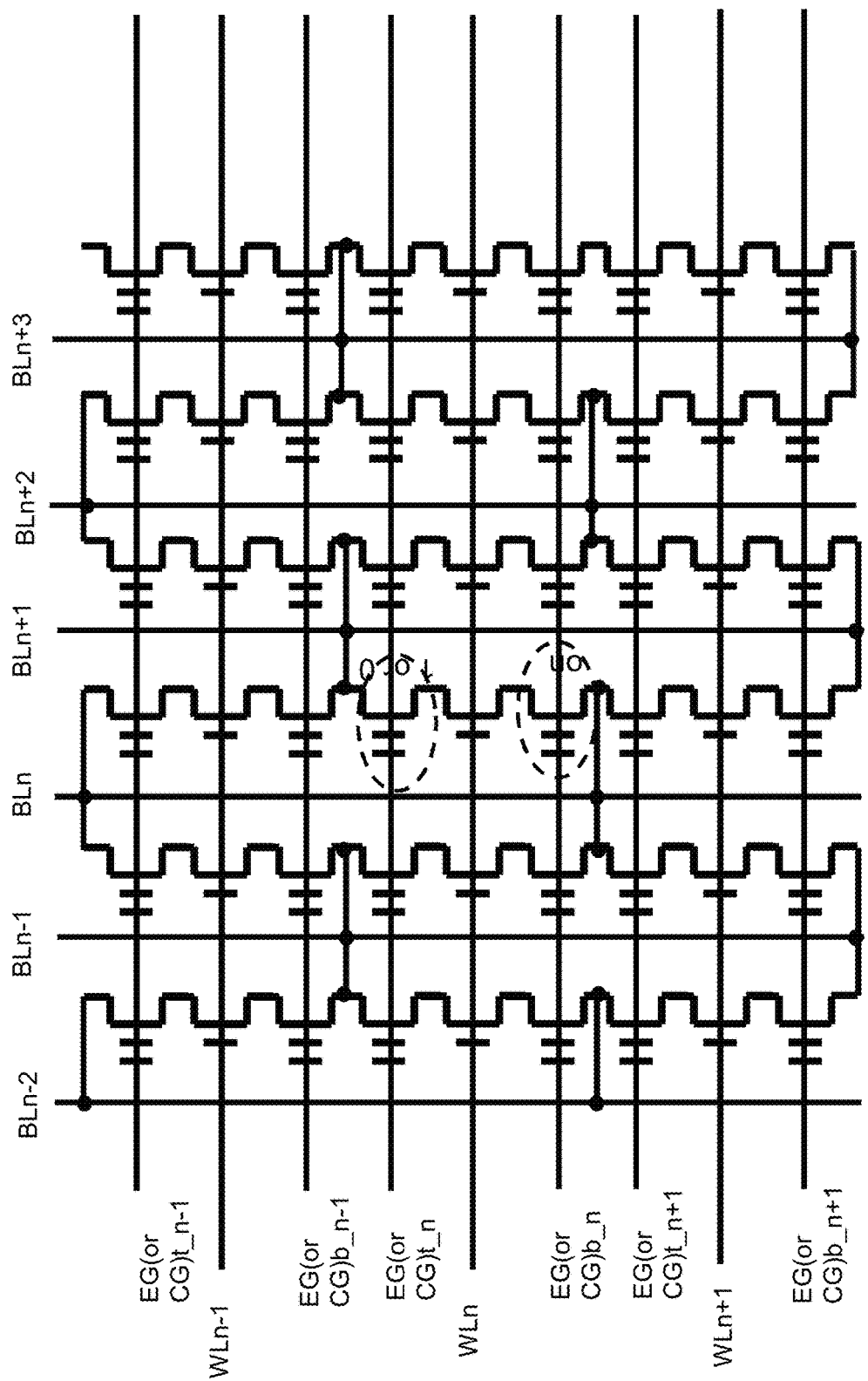
FIG. 5 is the schematic diagram of an array of the twin bit memory cells of FIG. 2D.

FIG. 5 is the schematic diagram of an array of the twin bit memory cells of FIG. 2D. The operational voltages and currents for such an array is illustrated in Table 2 below.

TABLE 2

|  | WL_n | UnSel WLs | EG (or CG)b_n | EG (or CG)t_n | UnSel EG (or CG)s | BLn | BLn + 1 | UnSel BLs |
|---|---|---|---|---|---|---|---|---|
| Read | 2.5 | 0 | >2.5 | 0 | 0 | 0.6~1.1 | 0 | 0 |
| Erase | 0 | 0 | 11.5 | 11.5 | 0 | 0 | 0 | 0 |
| Program | 1.0 | 0 | 4.5 | 4.5 | 0 | 1 uA | 4.5 | 0 |

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell configurations of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A twin bit memory cell, comprising:
   a semiconductor substrate having an upper surface;
   first and second trenches formed into the upper surface and spaced apart from each other;
   a first floating gate of conductive material disposed in the first trench and insulated from the substrate;
   a second floating gate of conductive material disposed in the second trench and insulated from the substrate;
   a first erase gate of conductive material disposed over and insulated from the first floating gate;
   a second erase gate of conductive material disposed over and insulated from the second floating gate;
   a word line gate of conductive material disposed over and insulated from a portion of the upper surface that is between the first and second trenches;
   a first source region formed in the substrate under the first trench;
   a second source region formed in the substrate under the second trench;
   wherein a continuous channel region of the substrate extends from the first source region, along a side wall of the first trench, along the portion of the upper surface that is between the first and second trenches, along a side wall of the second trench, and to the second source region.

2. The twin bit memory cell of claim 1, wherein the first trench only contains therein the first floating gate and insulation material that insulates the first floating gate from the substrate, and wherein the second trench only contains therein the second floating gate and insulation material that insulates the second floating gate from the substrate.

3. A twin bit memory cell, comprising:
   a semiconductor substrate having an upper surface;
   first and second trenches formed into the upper surface and spaced apart from each other;
   a first floating gate of conductive material disposed in the first trench and insulated from the substrate;
   a second floating gate of conductive material disposed in the second trench and insulated from the substrate;
   a first erase gate of conductive material disposed over and insulated from the first floating gate;
   a second erase gate of conductive material disposed over and insulated from the second floating gate;
   a word line gate of conductive material disposed over and insulated from a portion of the upper surface that is between the first and second trenches;
   a first source region formed at the upper surface of the substrate adjacent the first trench;
   a second source region formed at the upper surface of the substrate adjacent the second trench;
   wherein a continuous channel region of the substrate extends from the first source region, along a first side wall of the first trench, along a bottom wall of the first trench, along a second side wall of the first trench, along the portion of the upper surface that is between the first and second trenches, along a first side wall of the second trench, along a bottom wall of the second trench, along a second side wall of the second trench and to the second source region.

4. The twin bit memory cell of claim 3, wherein the first trench only contains therein the first floating gate and insulation material that insulates the first floating gate from the substrate, and wherein the second trench only contains therein the second floating gate and insulation material that insulates the second floating gate from the substrate.

5. A twin bit memory cell, comprising:
   a semiconductor substrate having an upper surface;
   first and second trenches formed into the upper surface and spaced apart from each other;
   first and second floating gates of conductive material disposed in the first trench spaced apart from each other and insulated from the substrate;
   third and fourth floating gates of conductive material disposed in the second trench spaced apart from each other and insulated from the substrate;
   a first erase gate of conductive material disposed over and insulated from the first and second floating gates;
   a second erase gate of conductive material disposed over and insulated from the third and fourth floating gates;
   a word line gate of conductive material disposed over and insulated from a portion of the upper surface that is between the first and second trenches;
   a first source region formed in the substrate under the first trench;
   a second source region formed in the substrate under the second trench;
   a first control gate of conductive material disposed in the first trench, and between and insulated from the first and second floating gates;
   a second control gate of conductive material disposed in the second trench, and between and insulated from the third and fourth floating gates;
   wherein a continuous channel region of the substrate extends from the first source region, along a side wall of the first trench, along the portion of the upper surface that is between the first and second trenches, along a side wall of the second trench, and to the second source region.

6. The twin bit memory cell of claim 5, wherein the first erase gate has a first portion that is disposed between the first and second floating gates, and a second portion that extends up and over the first and second floating gates, such that the first erase gate wraps around an edge of the first floating gate and wraps around an edge of the second floating gate; and
   wherein the second erase gate has a first portion that is disposed between the third and fourth floating gates, and a second portion that extends up and over the third and fourth floating gates, such that the second erase gate wraps around an edge of the third floating gate and wraps around an edge of the fourth floating gate.

7. A method of forming a twin bit memory cell, comprising:

forming first and second trenches into an upper surface of a semiconductor substrate, wherein the first and second trenches are spaced apart from each other;

forming a first floating gate of conductive material in the first trench and insulated from the substrate;

forming a second floating gate of conductive material in the second trench and insulated from the substrate;

forming a first erase gate of conductive material over and insulated from the first floating gate;

forming a second erase gate of conductive material over and insulated from the second floating gate;

forming a word line gate of conductive material over and insulated from a portion of the upper surface that is between the first and second trenches;

forming a first source region in the substrate under the first trench;

forming a second source region in the substrate under the second trench;

wherein a continuous channel region of the substrate extends from the first source region, along a side wall of the first trench, along the portion of the upper surface that is between the first and second trenches, along a side wall of the second trench, and to the second source region.

8. The method of claim 7, wherein the first trench only contains therein the first floating gate and insulation material that insulates the first floating gate from the substrate, and wherein the second trench only contains therein the second floating gate and insulation material that insulates the second floating gate from the substrate.

9. A method of forming a twin bit memory cell, comprising:

forming first and second trenches into an upper surface of a semiconductor substrate, wherein the first and second trenches are spaced apart from each other;

forming a first floating gate of conductive material in the first trench and insulated from the substrate;

forming a second floating gate of conductive material in the second trench and insulated from the substrate;

forming a first erase gate of conductive material over and insulated from the first floating gate;

forming a second erase gate of conductive material over and insulated from the second floating gate;

forming a word line gate of conductive material over and insulated from a portion of the upper surface that is between the first and second trenches;

forming a first source region at the upper surface of the substrate adjacent the first trench;

forming a second source region at the upper surface of the substrate adjacent the second trench;

wherein a continuous channel region of the substrate extends from the first source region, along a first side wall of the first trench, along a bottom wall of the first trench, along a second side wall of the first trench, along the portion of the upper surface that is between the first and second trenches, along a first side wall of the second trench, along a bottom wall of the second trench, along a second side wall of the second trench and to the second source region.

10. The method of claim 9, wherein the first trench only contains therein the first floating gate and insulation material that insulates the first floating gate from the substrate, and wherein the second trench only contains therein the second floating gate and insulation material that insulates the second floating gate from the substrate.

11. A method of forming a twin bit memory cell, comprising:

forming first and second trenches into an upper surface of a semiconductor substrate, wherein the first and second trenches are spaced apart from each other;

forming first and second floating gates of conductive material in the first trench spaced apart from each other and insulated from the substrate;

forming third and fourth floating gates of conductive material in the second trench spaced apart from each other and insulated from the substrate;

forming a first erase gate of conductive material over and insulated from the first and second floating gates;

forming a second erase gate of conductive material over and insulated from the third and fourth floating gates;

forming a word line gate of conductive material over and insulated from a portion of the upper surface that is between the first and second trenches;

forming a first source region in the substrate under the first trench;

forming a second source region in the substrate under the second trench;

forming a first control gate of conductive material in the first trench, and between and insulated from the first and second floating gates;

forming a second control gate of conductive material in the second trench, and between and insulated from the third and fourth floating gates;

wherein a continuous channel region of the substrate extends from the first source region, along a side wall of the first trench, along the portion of the upper surface that is between the first and second trenches, along a side wall of the second trench, and to the second source region.

12. The method of claim 11, wherein the first erase gate has a first portion that is disposed between the first and second floating gates, and a second portion that extends up and over the first and second floating gates, such that the first erase gate wraps around an edge of the first floating gate and wraps around an edge of the second floating gate; and wherein the second erase gate has a first portion that is disposed between the third and fourth floating gates, and a second portion that extends up and over the third and fourth floating gates, such that the second erase gate wraps around an edge of the third floating gate and wraps around an edge of the fourth floating gate.

* * * * *